(12) United States Patent
Izawa

(10) Patent No.: US 12,315,994 B2
(45) Date of Patent: May 27, 2025

(54) ANTENNA MODULE

(71) Applicant: Murata Manufacturing Co., Ltd., Kyoto (JP)

(72) Inventor: Masahiro Izawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 195 days.

(21) Appl. No.: 18/328,019

(22) Filed: Jun. 2, 2023

(65) Prior Publication Data

US 2023/0420833 A1  Dec. 28, 2023

(30) Foreign Application Priority Data

Jun. 28, 2022  (JP) ................................ 2022-103720

(51) Int. Cl.
*H01Q 1/42* (2006.01)
*H01Q 1/22* (2006.01)
*H01Q 1/52* (2006.01)

(52) U.S. Cl.
CPC ............. *H01Q 1/422* (2013.01); *H01Q 1/526* (2013.01)

(58) Field of Classification Search
CPC ........ H01Q 1/42; H01Q 1/422; H01Q 1/2283; H01Q 1/2291; H01Q 1/52; H01Q 1/526; H01Q 9/42
See application file for complete search history.

(56) References Cited

U.S. PATENT DOCUMENTS

2017/0194271 A1\* 7/2017 Hsu ....................... H01L 23/552

FOREIGN PATENT DOCUMENTS

| CN | 214544304 U | \* 10/2021 | ........... H01L 21/561 |
| JP | 2014-179821 A | 9/2014 | |

\* cited by examiner

*Primary Examiner* — Hoang V Nguyen
(74) *Attorney, Agent, or Firm* — McDonald Hopkins LLC

(57) ABSTRACT

An antenna module includes a main body, an antenna, and a shield electrode. The antenna includes an antenna electrode that covers a side surface of the main body. The shield electrode covers a top surface of the main body without being in contact with the antenna electrode. The main body includes a substrate, a plurality of electronic components and, a first dielectric layer, a second dielectric layer, at least one first ground connection electrode, and at least one second ground connection electrode. The electronic components and are mounted on the substrate. The first dielectric layer covers a first main surface of the substrate. The second dielectric layer covers a second main surface of the substrate. The at least one first ground connection electrode is in the form of a column extending through the first dielectric layer and connects the substrate to the shield electrode.

20 Claims, 11 Drawing Sheets

ANTENNA MODULE

CROSS REFERENCE TO RELATED APPLICATION

This application claims priority from Japanese Patent Application No. 2022-103720 filed on Jun. 28, 2022. The content of this application is incorporated herein by reference in its entirety.

BACKGROUND OF THE DISCLOSURE

1. Field of the Disclosure

The disclosure relates to an antenna module.

2. Description of the Related Art

An antenna-integrated module is disclosed in Japanese Unexamined Patent Application Publication No. 2014-179821. The antenna-integrated module disclosed in Japanese Unexamined Patent Application Publication No. 2014-179821 includes a substrate and a resin sealing layer disposed on one of two main surfaces of the substrate. The resin sealing layer covers a radio region and an antenna region that are provided on the one main surface. With the resin sealing layer formed by applying resin to the one main surface of the substrate, both the radio region and the antenna region are covered with the resin sealing layer.

A radio functional unit is disposed in the radio region on the substrate. The radio functional unit includes an electronic component in the radio region and a shield layer on part of a surface of the resin sealing layer. The electronic component is embedded in the resin sealing layer and includes a radio-frequency integrated circuit (RFIC). The shield layer is closer to the radio region than to the antenna region.

An antenna unit is disposed on the antenna region of the substrate. The antenna unit includes a matching circuit in the antenna region and an antenna conductor on part of the surface of the resin sealing layer. The antenna conductor is closer to the antenna region than to the radio region. The shield layer and the antenna conductor on the surface of the resin sealing layer are discretely located away from each other.

A signal electrode, an antenna electrode, and a ground electrode are disposed on the other main surface of the substrate to connect the antenna-integrated module to the outside. The signal electrode is connected to the radio functional unit with an internal wiring pattern therebetween. The antenna electrode is connected to the antenna conductor with the internal wiring pattern therebetween. The ground electrode is connected to the shield electrode with the internal wiring pattern therebetween.

Research and development are under way to provide various devices for ultrahigh-speed, large-capacity communication that supports up-to-date communication systems, such as the fifth-generation mobile communication system (5G) and the sixth-generation mobile communication system (6G). Electronic components for use in the ultrahigh-speed, large-capacity communication tend to be large in size. Meanwhile, an antenna module including such an electronic component is expected to adapt to the demand for miniaturization.

The adoption of a larger electronic component into the antenna-integrated module described in Japanese Unexamined Patent Application Publication No. 2014-179821 necessitates a larger substrate with an enough mounting space for the electronic component or a reduction in the space between the constituent components of the antenna-integrated module. An antenna-integrated module including such a large substrate is large in size, and thus, a larger mounting space for the antenna-integrated module is necessitated. An antenna-integrated module including densely packed components would exhibit poor antenna characteristics.

BRIEF SUMMARY OF THE DISCLOSURE

It is a possible benefit of the disclosure to provide an antenna module that may be small in size and is capable of exhibiting improved antenna characteristics.

According to an aspect of the disclosure, an antenna module includes a main body, an antenna, and a shield electrode. The main body has a top surface, a bottom surface, and a plurality of side surfaces. The top surface and the bottom surface are opposite to each other in a height direction. The antenna includes an antenna electrode that covers one of the plurality of side surfaces. The shield electrode covers the top surface without being in contact with the antenna electrode. The main body includes a substrate, a plurality of electronic components, a first dielectric layer, a second dielectric layer, at least one first ground connection electrode, and at least one second ground connection electrode. The substrate has a first main surface and a second main surface. The plurality of electronic components are mounted on the substrate and are connected to the antenna. The first dielectric layer covers the first main surface and defines the top surface. The second dielectric layer covers the second main surface and defines the bottom surface. The at least one first ground connection electrode is in the form of a column extending through the first dielectric layer and connects the substrate to the shield electrode. The at least one second ground connection electrode is in the form of a column extending through the second dielectric layer and is for use in connecting the substrate to the ground of an external substrate. The at least one second ground connection electrode is located within the shield electrode when viewed in the height direction.

The antenna module according to an aspect of the disclosure may be small in size and is capable of exhibiting improved antenna characteristics.

DETAILED DESCRIPTION OF THE DISCLOSURE

1. Embodiment

Figure 1:
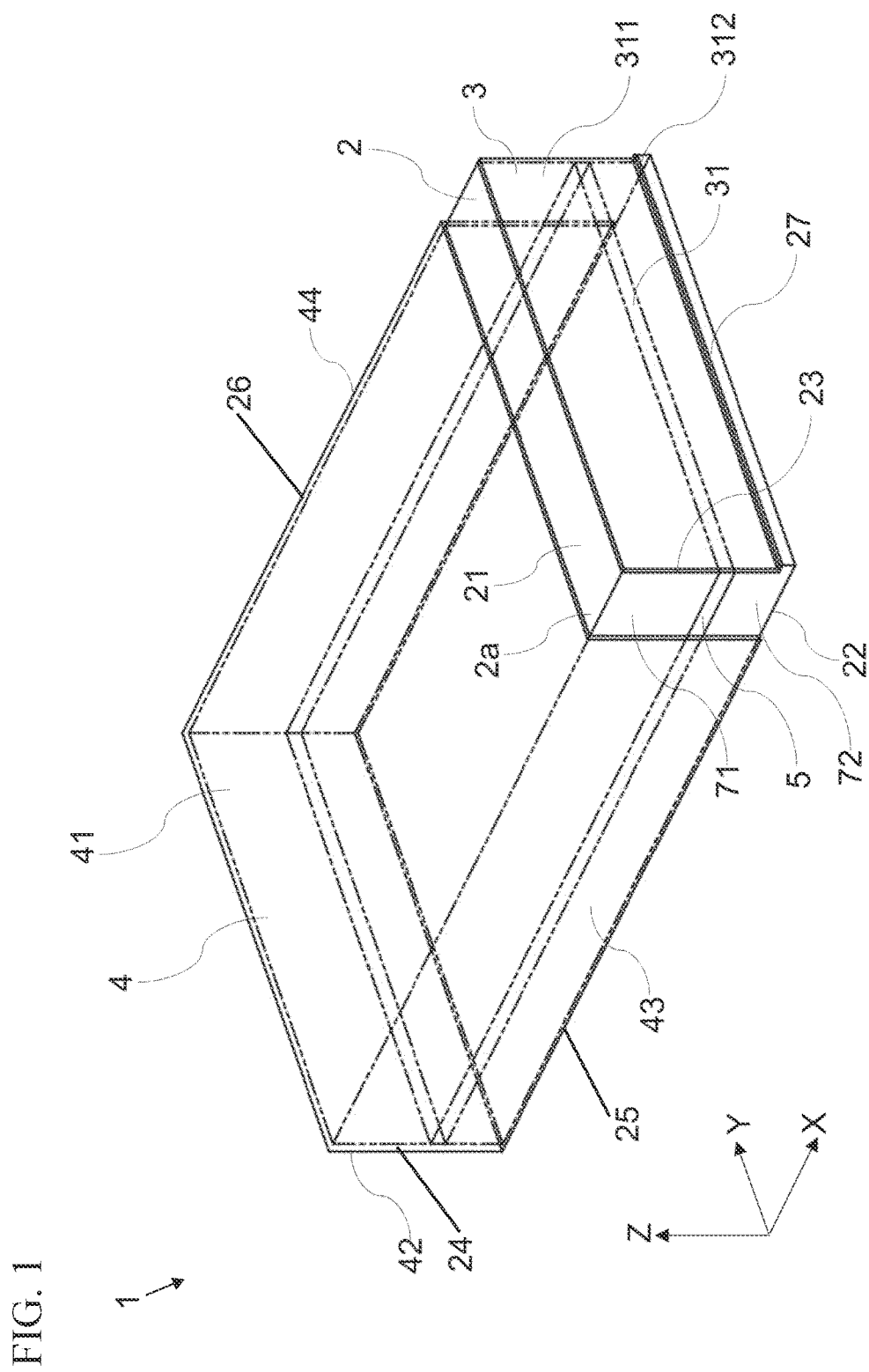
FIG. 1 is a perspective view of an antenna module according to an embodiment, illustrating an example configuration of the antenna module.

An embodiment of the disclosure will be described below, with reference to the drawings as necessary. The embodiment is an example for describing what is disclosed herein and is not to be construed as limiting the disclosure to the specifics (e.g., the shapes, dimensions, and arrangement of constituent components) that will be mentioned below. Unless otherwise specified, words such as up, down, left, and right are hereinafter used to describe the positional relationship based on the accompanying drawings. The drawings, which will be referred to in the following embodiment, are schematic views, in which constituent elements are not drawn to scale, and the size and thickness ratios thereof do not necessarily fully correspond to the actual dimension ratios. The actual dimension ratio of each constituent element does not necessarily agree with the dimension ratio in the drawings.

The words "first", "second", and so on in the following description are identifiers for distinguishing between constituent elements. For the sake of simplicity, the identifiers "first", "second" and so on may be omitted when the constituent components are distinguishable from each other.

The expression "connected to" in the description of the circuit configuration disclosed herein refers to not only direct connection formed by a connection terminal and/or a wiring conductor but also electrical connection formed by another circuit component. For example, the expression "connected between A and B" means that an element is located between A and B and connected to A and B. The expression "electrically connected" means that electrically connected elements contact each other directly or indirectly.

[1.1. Configuration]

Figure 2:
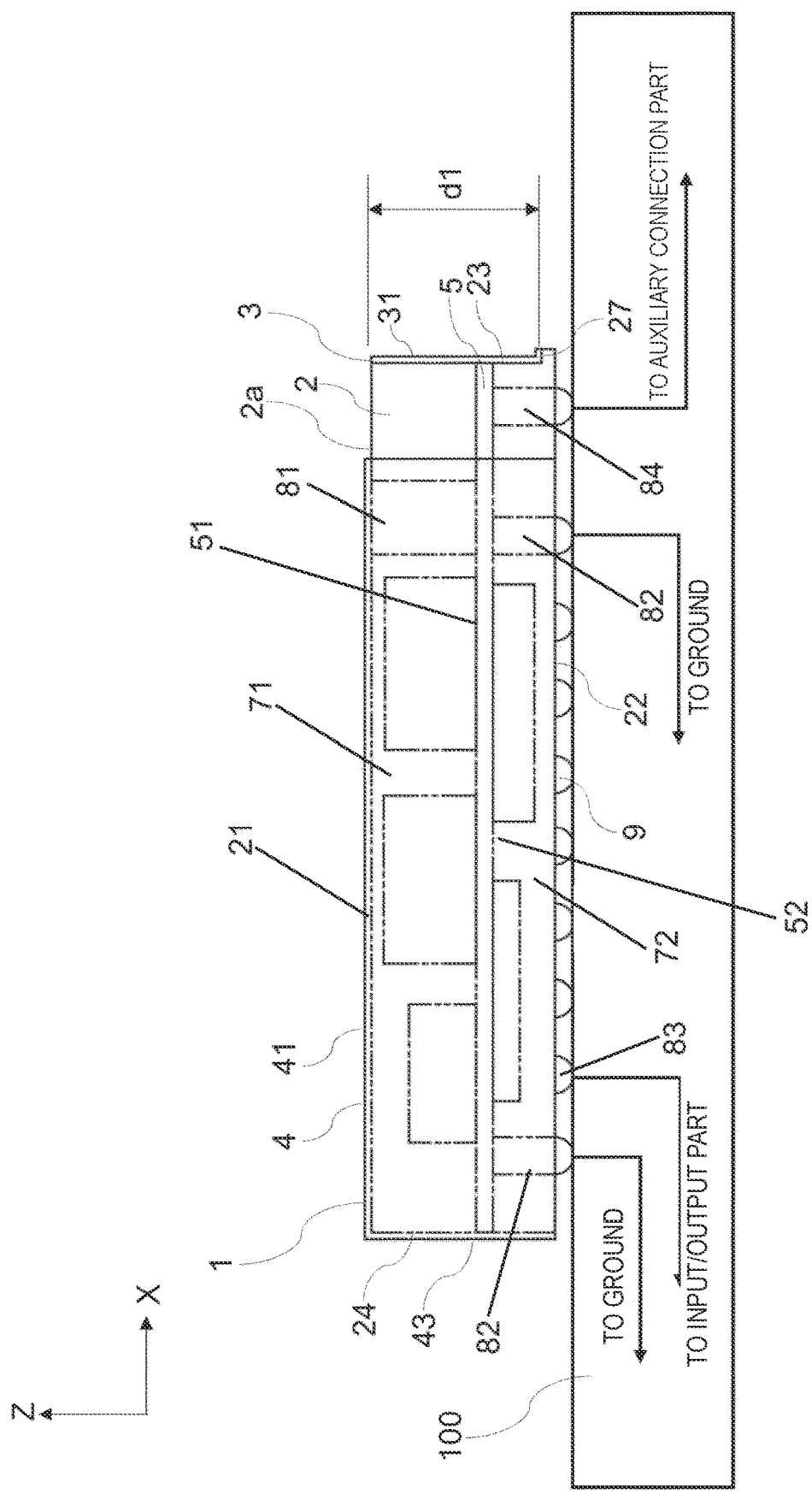
FIG. 2 is a side view of the antenna module in FIG. 1.

FIG. 1 is a perspective view of an antenna module 1 according to an embodiment, illustrating an example configuration of the antenna module. FIG. 2 is a side view of the antenna module 1 in FIG. 1. A Cartesian coordinate system defined by three axes (X, Y, and Z) in FIG. 1 will be mentioned only for the sake of clarity.

An antenna module 1 is to be installed in a device to enable communication in a predetermined frequency band. For example, the antenna module 1 is mounted on an external substrate 100 (see FIG. 2). The external substrate 100 may be a mounting substrate of an information terminal, such as a smartphone or a tablet.

Referring to FIGS. 1 and 2, the antenna module 1 includes a main body 2, an antenna 3, and a shield electrode 4.

Referring to FIG. 1, the main body 2 has a top surface, a bottom surface, and side surfaces. The top surface and the bottom surface are opposite to each other in a height direction (the Z direction in FIG. 1) and are denoted by 21 and 22, respectively. The side surfaces are denoted by 23 to 26, respectively.

FIG. 2 is a side view of the antenna module 1 in FIG. 1. The bottom surface 22 of the main body 2 faces the external substrate 100, on which the main body 2 is mounted. The top surface 21 is opposite to the bottom surface 22. In the present embodiment, the top surface 21 and the bottom surface 22 are opposite to each other in a direction hereinafter referred to as the height direction. The height direction of the main body 2 may coincide with the vertical direction, depending on the mounting condition of the main body 2, the placement of the external substrate 100, and the like.

Referring to FIG. 1, the main body 2 is a rectangular parallelepiped and has four side surfaces respectively denoted by 23 to 26. Two of the four side surfaces 23 to 26 or, more specifically, the side surfaces 23 and 24 are opposite to each other in a first direction (the X direction in FIG. 1) orthogonal to the height direction of the main body 2. The other two side surfaces, namely, the side surfaces 25 and 26 are opposite to each other in a second direction (the Y direction in FIG. 1) orthogonal to the height direction of the main body 2 and to the first direction. In the present embodiment, the dimension of the main body 2 in the first direction is greater than the dimension of the main body 2 in the second direction. Thus, the first direction and the second direction may be regarded as the longitudinal direction and the width direction, respectively, of the main body 2.

Referring to FIG. 1, the main body 2 has a protrusion 27. The protrusion 27 is located on one of the side surfaces 23 to 26. To be more specific, the protrusion 27 is located on the side surface 23. The protrusion 27 will be described later.

Figure 3:
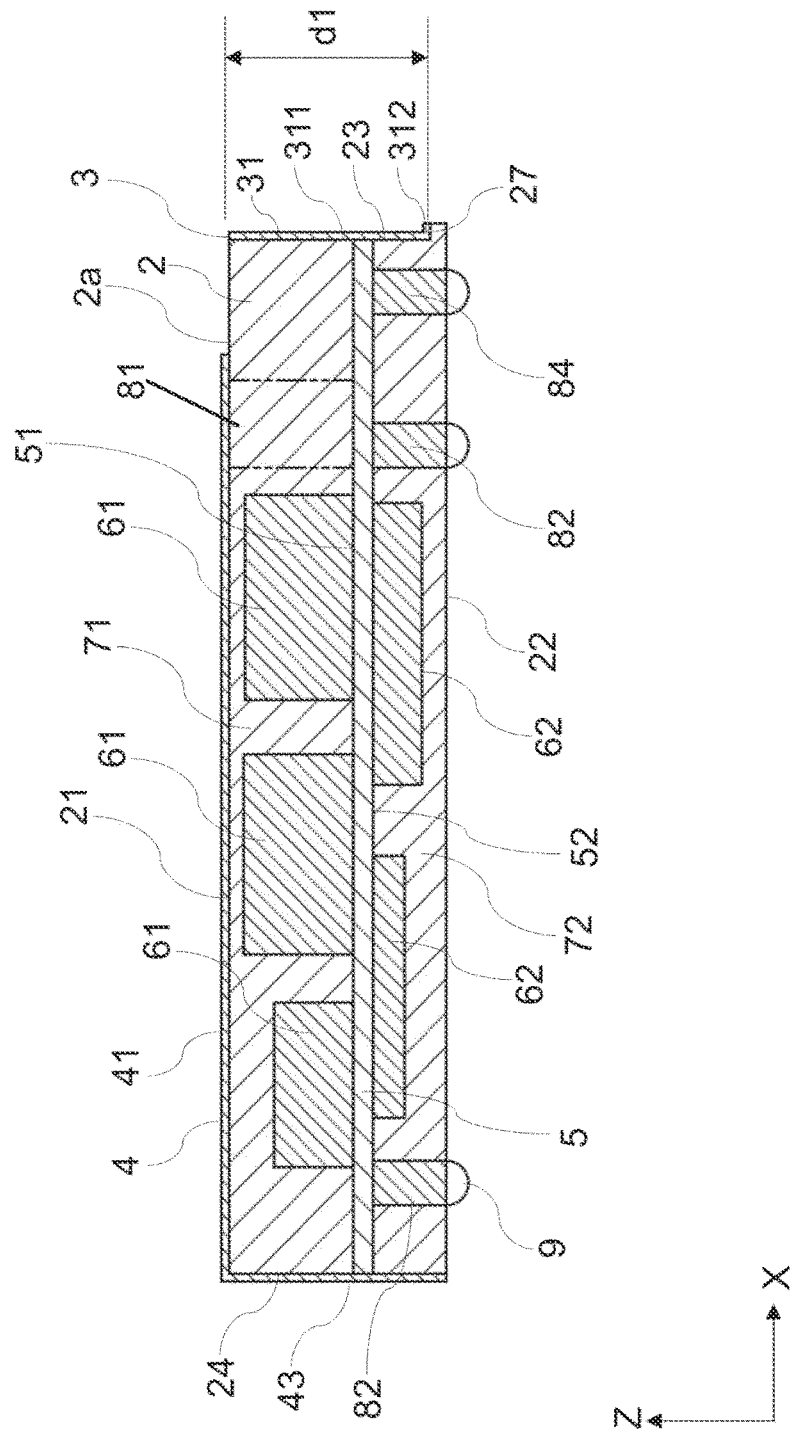
FIG. 3 is a sectional view of the antenna module in FIG. 1.

FIG. 3 is a sectional view of the antenna module 1. FIG. 3 is a sectional view taken along line A-A in FIG. 6.

Referring to FIG. 3, the main body 2 includes a substrate 5, electronic components (first electronic components 61 and second electronic components 62), a first dielectric layer 71, and a second dielectric layer 72.

The substrate 5 has a first main surface 51 and a second main surface 52. The second main surface 52 is opposite to the first main surface 51. For example, the first main surface 51 and the second main surface 52 are opposite to each other in the thickness direction of the substrate 5. The thickness direction of the substrate 5 in the present embodiment coincides with the height direction of the main body 2.

The substrate 5 may, for example, be a dielectric substrate. Substrates that may be used as the dielectric substrate include: a low-temperature co-fired ceramic (LTCC) multilayer substrate; a multilayer resin substrate including epoxy layers, polyimide layers, or other resin layers stacked on top of one another; a multilayer resin substrate including resin layers made from liquid crystal polymer (LCP) of lower dielectric constant and stacked on top of one another; a multilayer resin substrate including fluororesin layers stacked on top of one another; and ceramic multilayer substrates other than the LTCC multilayer substrates.

The electronic components are mounted on the substrate 5 and are connected to the antenna 3. The electronic components constitute a communication circuit for use in communication performed through the antenna 3. Examples of the electronic components include switching circuits, switching integrated circuits, filter circuits, power amplifier circuits, signal processing circuits (such as RFICs and BBICs), matching circuits, and various kinds of chip components (such as capacitors and inductors).

The electronic components in the present embodiment include the first electronic components 61 and the second electronic components 62. The first electronic components 61 are mounted on the first main surface 51, and the second electronic components 62 are mounted on the second main surface 52. Both the first main surface 51 and the second main surface 52 of the substrate 5 in the present embodiment serve as a mounting place for electronic components. Unlike the case in which only one of the first main surface 51 and the second main surface 52 of the substrate 5 is a mounting place for electronic components, the antenna module according to the present embodiment can achieve miniaturization and improved antenna characteristics at the same time.

The first dielectric layer 71 covers the first main surface 51 and defines the top surface 21. With the first electronic components 61 being mounted on the first main surface 51, the first dielectric layer 71 in the present embodiment covers the first main surface 51 as well as the first electronic components 61. The top surface 21 may be regarded as one of two opposite surfaces of the first dielectric layer 71. The top surface 21 is farther than the other one of the two opposite surfaces of the first dielectric layer 71 from the substrate 5; that is, the top surface 21 is an upper surface in FIG. 2. The first dielectric layer 71 is made of a resin material having insulating properties. Thermosetting resin commonly used for molding may be used as the material of the first dielectric layer 71. For example, the first dielectric layer 71 may be made of epoxy resin or cyanate resin.

The second dielectric layer 72 covers the second main surface 52 and defines the bottom surface 22. With the second electronic components 62 being mounted on the second main surface 52, the second dielectric layer 72 in the present embodiment covers the second main surface 52 as well as the second electronic components 62. The bottom surface 22 may be regarded as one of two opposite surfaces of the second dielectric layer 72. The bottom surface 22 is closer than the other one of the two opposite surfaces of the second dielectric layer 72 to the substrate 5; that is, the top surface 21 is a lower surface in FIG. 2. The second dielectric layer 72 is made of a resin material having insulating properties. Thermosetting resin commonly used for molding may be used as the material of the second dielectric layer 72. For example, the second dielectric layer 72 may be made of epoxy resin or cyanate resin.

Figure 4:
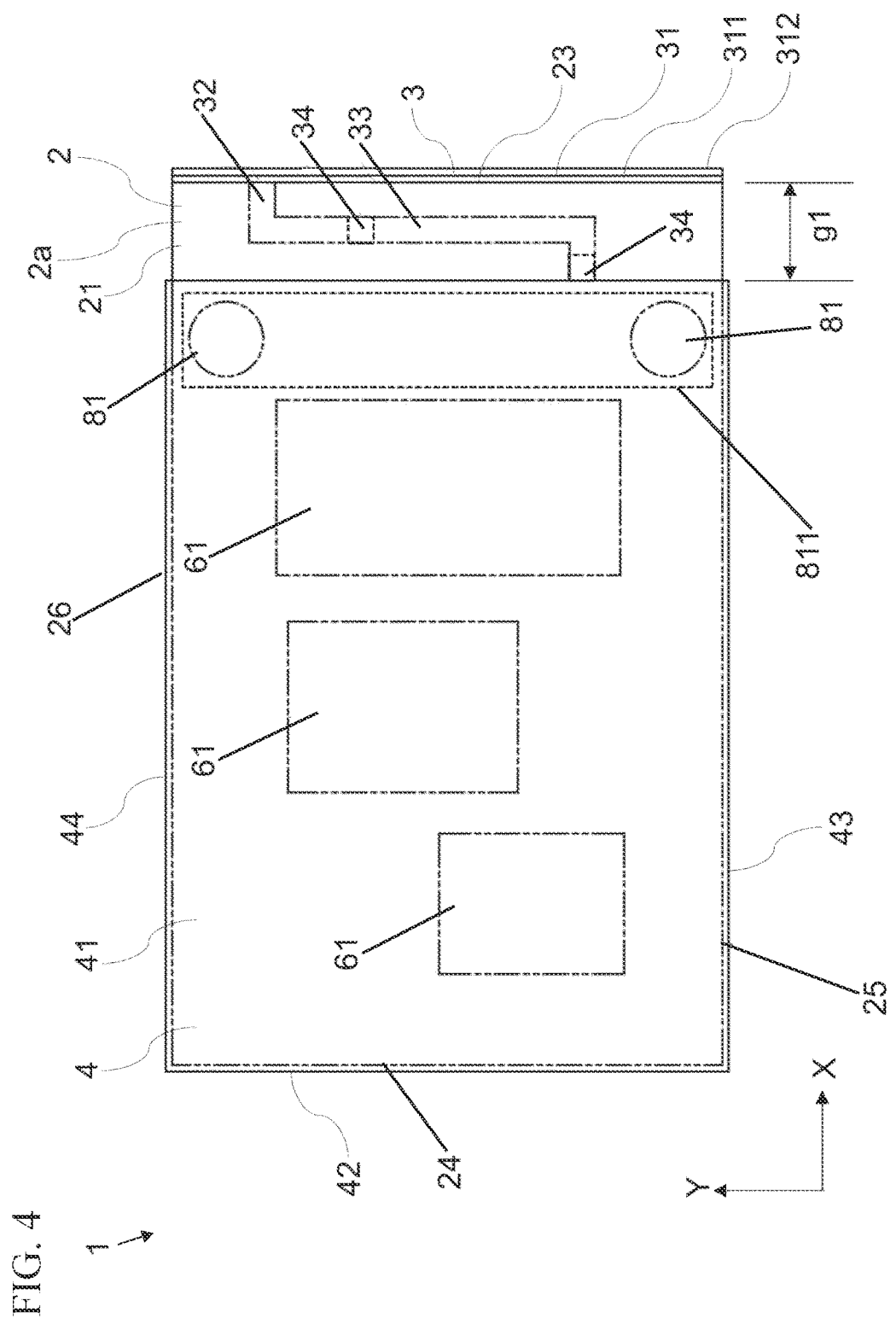
FIG. 4 is a plan view of the antenna module in FIG. 1.

FIG. 4 is a plan view of the antenna module 1. As illustrated in FIG. 4, the substrate 5, the first dielectric layer 71, and the second dielectric layer 72 of the main body 2 have the same outer shape when viewed in the height direction (the Z direction in FIG. 1). Referring to FIG. 1, each of the side surfaces 23 to 26 of the main body 2 includes the corresponding one of the side surfaces of the substrate 5, the corresponding one of the side surfaces of the first dielectric layer 71, and the corresponding one of the side surfaces of the second dielectric layer 72.

The protrusion 27 is part of the second dielectric layer 72. As illustrated in FIGS. 1 and 2, the protrusion 27 is located on one of the side surfaces or, more specifically, the side surface 23 and is located on one end portion closer than the other end portion of the side surface 23 to the bottom surface 22. That is, the protrusion 27 of the second dielectric layer 72 is adjacent to one end portion closer than the other end portion of the side surface 23 to the bottom surface 22. As illustrated in FIG. 1, the protrusion 27 is a rectangular parallelepiped. The protrusion 27 extends all along an edge of the side surface 23 in the second direction.

The exterior (the top surface 21, the bottom surface 22, the side surfaces 23 to 26) of the main body 2 in the present embodiment is defined by the substrate 5, the first dielectric layer 71, and the second dielectric layer 72.

The antenna 3 and the shield electrode 4 are provided to the main body 2.

For example, the antenna 3 is a grounded λ/4 monopole antenna. The antenna 3 is shaped in accordance with the frequency band in which communication is performed through the use of the antenna 3. For example, the antenna 3 may be adapted to communication in the frequency band (e.g., a frequency of about 2.4 GHz) used for Bluetooth (registered trademark).

Referring to FIG. 1, the antenna 3 includes an antenna electrode 31, with which one of the side surfaces 23 to 26 or, more specifically, the side surface 23 is covered. The antenna electrode 31 in the present embodiment is entirely located on the side surface 23. In other words, the antenna electrode 31 is not located on the surfaces other than the side surface 23; that is, the antenna electrode 31 is not located on the top surface 21, the bottom surface 22, and the side surfaces 24 to 26. The antenna 3 may thus be small in size and is capable of exhibiting improved antenna characteristics.

Referring to FIG. 2, the antenna electrode 31 extends across the first dielectric layer 71 and the second dielectric layer 72 in the height direction. The area of the antenna electrode 31 in this case is larger than the area of the antenna electrode 31 in a case where the antenna electrode 31 does not extend off the edge of the first dielectric layer 71. Accordingly, improved antenna characteristics may be exhibited.

The antenna electrode 31 in the present embodiment includes a first section 311 and a second section 312.

The first section 311 covers the side surface 23 or, more specifically, a region extending from the surface's edge adjacent to the top surface 21 to the protrusion 27. With the side surface 23 being mostly covered with the antenna electrode 31, one end portion closer than the other end portion of the side surface 23 to the bottom surface 22 is exposed to view. Thus, the antenna electrode 31 is farther from the external substrate 100 than in the case of extending across the side surface 23 from the edge adjacent to the top surface 21 to the edge adjacent to bottom surface 22. The capacitive coupling that could possibly be provided between the external substrate 100 and the antenna electrode 31 is reduced accordingly. The main body 2 in the present embodiment has the protrusion 27, which is located on the end portion closer than the other end portion of the side surface 23 to the bottom surface 22. This feature also leads to a reduction in the capacitive coupling that could possibly be provided between the external substrate 100 and the antenna electrode 31. The dimension of the protrusion 27 in the height direction is set in accordance with the intended distance between the external substrate 100 and the first section 311 of the antenna electrode 31.

The second section 312 extends from an edge of the first section 311 and along the protrusion 27. The antenna electrode 31 is L-shaped when viewed in the second direction defined in relation to the main body 2. The area of the antenna electrode 31 in this case is larger than the area of the antenna electrode 31 in a case where the antenna electrode 31 includes the first section 311 only. That is, the second section 312 yields an increase in the area of the antenna electrode 31. Accordingly, improved antenna characteristics may be exhibited. The dimension of the protrusion 27 in the first direction, that is, the distance over which the protrusion 27 extends in the first direction is set as appropriate in accordance with the dimension of the second section 312 as will be described later. Although the dimension of the protrusion 27 in the first direction is not limited to a particular value, the dimension of the protrusion 27 in the present embodiment be equal to 15% of the dimension of the main body 2 in the first direction.

As illustrated in FIG. 1, the side surface 23 is entirely covered with the antenna electrode 31 in a direction (the second direction, namely, the Y direction in FIG. 1) orthogonal to the height direction (the Z direction in FIG. 1) within a plane (the YZ plane in FIG. 1) in which the side surface 23 extends. In other words, the antenna electrode 31 extends from one edge to the other edge of the side surface 23 in the second direction. Thus, the area of the antenna electrode 31 may be large enough to yield an improvement in antenna characteristics.

The antenna 3 includes an adjustment circuit 32, which is connected to the antenna electrode 31. The adjustment circuit 32 is located on the substrate 5. The adjustment circuit 32 will be described later.

The shield electrode 4 is to prevent the potential exposure of the electronic components (the first electronic components 61 and the second electronic components 62) on the substrate 5 to electromagnetic fields. As illustrated in FIG. 1, the shield electrode 4 covers the top surface 21 of the main body 2 without being in contact with the antenna electrode 31. The shield electrode 4 in the present embodiment covers the side surfaces other than the side surface 23, namely, the side surfaces 24 to 26 as well as the top surface 21 without being in contact with the antenna electrode 31. Thus, the shield electrode 4 is capable of producing an improved shielding effect; that is, the shield electrode 4 may have improved capability of blocking electromagnetic fields. More specifically, the shield electrode 4 includes a top surface portion denoted by 41 and side surface portions respectively denoted by 42, 43, and 44. The top surface portion 41 covers the top surface 21, and the side surface portions 42, 43, and 44 cover the side surfaces 24, 25, and 26, respectively.

The top surface portion 41 is rectangular when viewed in the height direction (the Z direction). With the top surface 21 being entirely covered with the top surface portion 41 in the second direction and mostly covered with the top surface portion 41 in the first direction, one end portion closer than the other end portion of the top surface 21 to the side surface 23 is exposed to view. More specifically, the top surface portion 41 has an edge (a right edge in FIG. 4) extending along the side surface 23 and discretely located away from the antenna electrode 31, as illustrated in FIG. 4. The side surface portion 42 is rectangular when viewed in the first direction (the X direction). The side surface 24 is entirely covered with the side surface portion 42 in both the height direction and the second direction. The side surface portions 43 and 44 are rectangular when viewed in the second direction (the Y direction). With each of the side surfaces 25 and 26 being entirely covered with the corresponding one of the side surface portions 43 and 44 in the height direction and mostly covered with the corresponding one of the side surface portions 43 and 44 in the first direction, end portions closer than the other end portions of the side surfaces 25 and 26 to the side surface 23 are exposed to view from the outside. More specifically, the side surface portion 43 and 44 each have an edge (a right edge in FIG. 4) extending along the side surface 23 and discretely located away from the antenna electrode 31, as illustrated in FIG. 4.

The shield electrode 4 is disposed on the main body 2, part of which is exposed to view in a gap g1 between the shield electrode 4 and the antenna electrode 31. The portion being part of the main body 2 and exposed to view in the gap g1 is not covered with the shield electrode 4. Thus, a region being part of the substrate 5 and corresponding to the portion of the main body 2 may thus be used as a mounting place for the antenna. The region being part of the substrate 5 and being available for use as a mounting place for the antenna is hereinafter referred as an antenna area 2a. The size of the gap g1 is set as appropriate such that the shield electrode 4 and the antenna electrode 31 do not affect each other.

Figure 5:
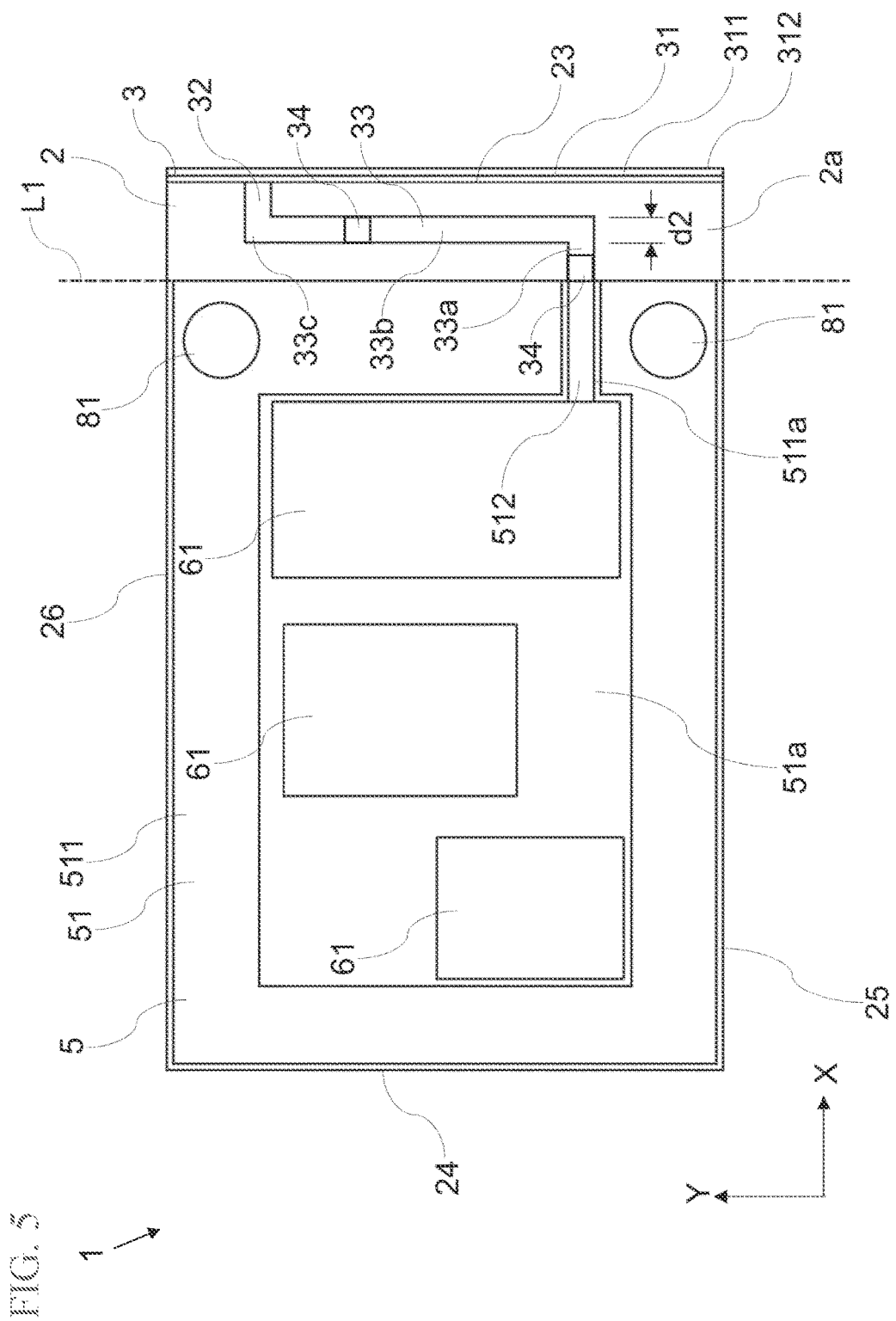
FIG. 5 is a plan view of the antenna module in FIG. 1 (part of which is omitted)

FIG. 5 is a plan view of the antenna module 1, part of which is omitted. The shield electrode 4 and the first dielectric layer 71 are omitted from the antenna module 1 in FIG. 5. A broken line denoted by L1 in FIG. 5 indicates the position of one edge closer than the other edges of the shield electrode 4 to the side surface 23.

As illustrated in FIGS. 4 and 5, the adjustment circuit 32 of the antenna 3 is located between the antenna electrode 31 and the shield electrode 4 when viewed in the height direction. That is, the adjustment circuit 32 is located in the antenna area 2a of the substrate 5. The adjustment circuit 32 is connected to the antenna electrode 31 and includes a wiring portion 33 and an adjustment element 34. The wiring portion 33 is for use in adjusting the electrical length of the antenna 3. The electrical length of the antenna 3 is dependent on the shape of the wiring portion 33 and the shape of the antenna electrode 31. The wiring portion 33 is shaped as appropriate such that the antenna 3 is adjusted to a desired electrical length. The adjustment element 34 is for use in tuning the antenna 3 to a specified frequency (resonant frequency). For example, the adjustment element 34 is a capacitor or an inductor. Referring to FIG. 5, the adjustment element 34 may be disposed somewhere between ends of the wiring portion 33 or may be disposed between part of the wiring portion 33 and the ground. The antenna 3 may include the adjustment circuit 32 for ease of delivering desired performance.

Referring to FIG. 5, the wiring portion 33 includes a section 33a, a section 33b, and a section 33c. The section 33a extends in the first direction and is connected to the electronic components. The section 33b extends from the section 33a in the second direction. The section 33c extends from the section 33b in the first direction and is connected to the antenna electrode 31. The section 33b of the wiring portion 33 extends in a direction (the Y direction) that forms an angle with both the height direction (the Z direction) and the direction (the X direction) normal to the side surface 23. The length of the section 33b may be adjusted such that a desired overall length of the wiring portion 33 is achieved. This provides the ease of ensuring that the antenna 3 has the desired electrical length.

In the present embodiment, d1 is greater than d2, where d1 denotes the dimension of the antenna electrode 31 in the height direction (see FIG. 2) and d2 denotes the width of the wiring portion 33 (see FIG. 5). The distal end of the antenna 3 is wider than the proximal end of the antenna 3. The antenna 3 is thus capable of exhibiting improved antenna characteristics. The width d2 of the wiring portion 33 is short. The narrowing of the wiring portion 33 leads to a reduction in the capacitive coupling that could possibly be provided between the external substrate 100 and the antenna electrode 31. The dimension d1 of the antenna electrode 31 in the height direction is equal to the dimension of the first section 311 of the antenna electrode 31 in the height direction.

Referring to FIG. 5, the substrate 5 is provided with a ground pattern 511, which is connected to the shield electrode 4. The ground pattern 511 in the present embodiment is located within the shield electrode 4 when viewed in the height direction. For example, the ground pattern 511 is formed on the first main surface 51 of the substrate 5. The ground pattern 511 may, for example, be provided in a mounting region 51a, which is part of the substrate 5 and a mounting place for the electronic components. The ground pattern 511 includes a passage 511a, which forms a connection between the mounting region 51a and the antenna area 2a. A connection line 512 is provided in the passage 511a to connect the antenna 3 to an electronic component (e.g., one of the first electronic components 61 in FIG. 5). The connection line 512 is separate from the ground pattern 511. The connection line 512 in the present embodiment connects the first electronic component 61 to the section 33a of the wiring portion 33 of the antenna 3. The first electronic component 61 is connected to the antenna electrode 31 accordingly.

Referring to FIGS. 2 and 3, the main body 2 includes first ground connection electrodes 81, second ground connection electrodes 82, input/output connection electrodes 83, and auxiliary connection electrodes 84.

The first ground connection electrodes 81 are for use in connecting the substrate 5 to the shield electrode 4. More specifically, the first ground connection electrodes 81 are for use in connecting the ground pattern 511 of the substrate 5 to the shield electrode 4. As illustrated in FIG. 3, the first ground connection electrodes 81 are each in the form of a column extending through the first dielectric layer 71. The first ground connection electrodes 81 are made of metal, such as copper. That is, the first ground connection electrodes 81 are columnar electrodes (posts) made of metal. The first ground connection electrodes 81 in the present embodiment each have an end portion exposed at the top surface 21 and being in direct contact with the top surface portion 41 of the shield electrode 4.

The main body 2 in the present embodiment includes more than one first ground connection electrode 81. Referring to FIG. 4, the main body 2 includes two first ground connection electrodes 81. The two first ground connection electrodes 81 constitute a first sequence 811 (see FIGS. 4 and 5), in which the two first ground connection electrodes 81 are aligned in a predetermined direction (the Y direction) that forms an angle with both the height direction and the direction normal to the side surface 23. Referring to FIG. 5, the first sequence 811 is located within the shield electrode 4 when viewed in the height direction (the Z direction). The first sequence 811 within the shield electrode 4 is adjacent to the side surface 23 when viewed in the height direction (Z direction).

The second ground connection electrodes 82 are for use in connecting the substrate 5 to the ground of the external substrate 100 (see FIG. 2). The second main surface 52 of the substrate 5 is covered with the second dielectric layer 72 included in the main body 2. Thus, the substrate 5 is provided with the second ground connection electrodes 82 for the connection to the ground of the external substrate 100. More specifically, the second ground connection electrodes 82 are for use in connecting the ground pattern 511 of the substrate 5 to the shield electrode 4. As illustrated in FIG. 3, the second ground connection electrodes 82 are each in the form of a column extending through the second dielectric layer 72. The diameter of the second ground connection electrodes 82 in the present embodiment is shorter than the diameter of the first ground connection electrodes 81; nevertheless, this feature is not indispensable. The second ground connection electrodes 82 are made of metal, such as copper. That is, the second ground connection electrodes 82 are columnar electrodes (posts) made of metal. The second ground connection electrodes 82 in the present embodiment each have an end portion exposed at the bottom surface 22. Each of the second ground connection electrodes 82 is connectable to the ground of the external substrate 100 with, for example, bumps therebetween. The bumps are herein denoted by 9.

From the standpoint of the antenna electrode 31, the second ground connection electrodes 82 connected to the ground of the external substrate 100 may be regarded as the equivalent of the shield electrode 4. Bringing the second ground connection electrodes 82 into closer proximity to the antenna electrode 31 is synonymous with bringing the shield electrode 4 into closer proximity to the antenna electrode 31. With this in view, the second ground connection electrodes 82 are disposed within the shield electrode 4 viewed in the height direction (the Z direction). Thus, it is less likely that the second ground connection electrodes 82 will seemingly increase the adjacency of the antenna electrode 31 to the shield electrode 4. The second ground connection electrodes 82 may be included in such a way as not to interfere with the planned improvement of antenna performance.

Figure 6:
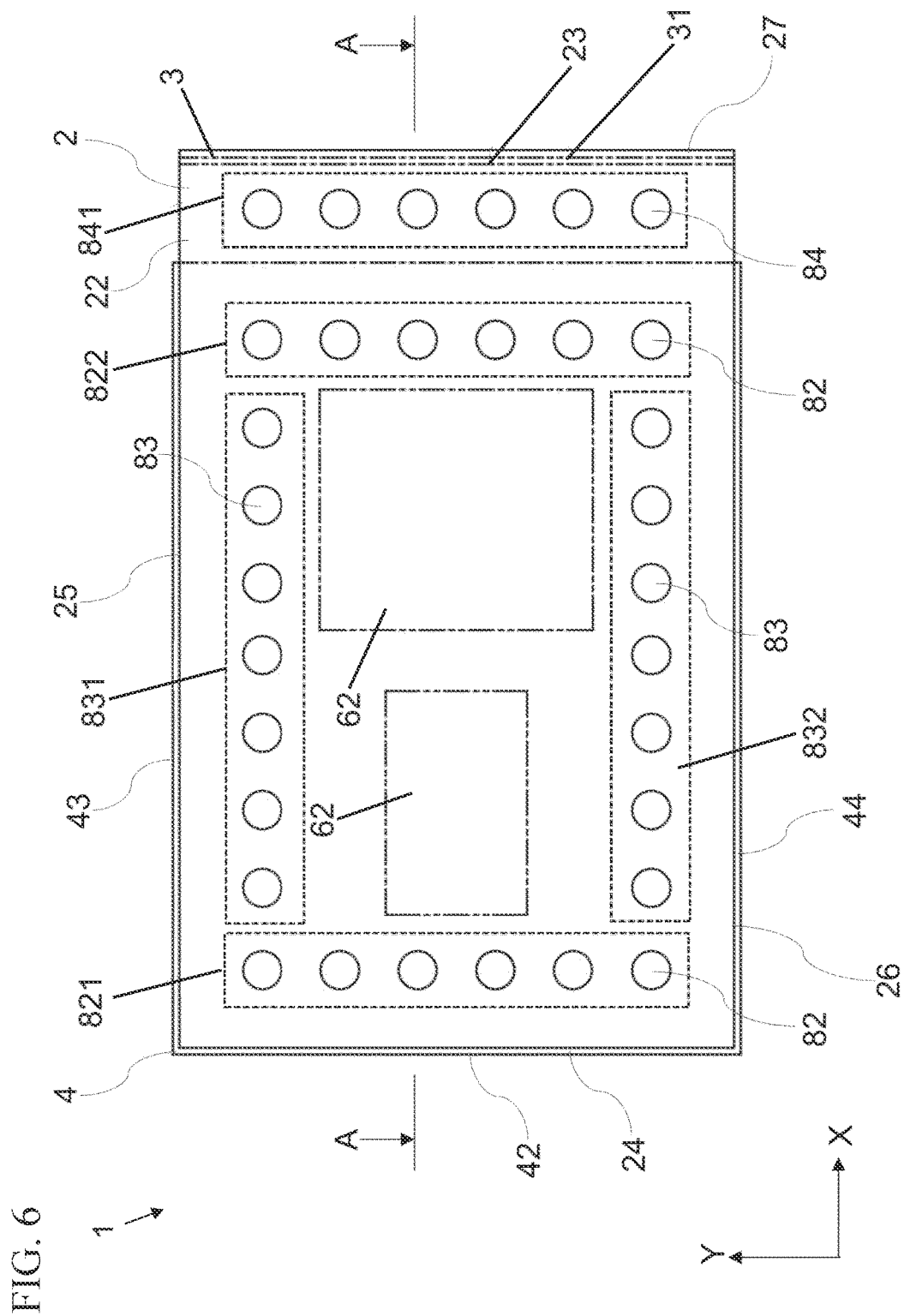
FIG. 6 is a bottom view of the antenna module in FIG. 1.

FIG. 6 is a bottom view of the antenna module 1. The main body 2 in the present embodiment (see FIG. 6) includes more than one second ground connection electrode 82. Referring to FIG. 6, the main body 2 includes twelve second ground connection electrodes 82. The twelve second ground connection electrodes 82 constitute second sequences 821 and 822 (see FIG. 6), in which the twelve second ground connection electrodes 82 are aligned in a predetermined direction (the Y direction) that forms an angle with both the height direction and the direction normal to the side surface 23. The second sequences 821 and 822 each include six second ground connection electrodes 82. Referring to FIG. 6, the second sequences 821 and 822 are located within the shield electrode 4 when viewed in the height direction (the Z direction). The second sequence 821 within the shield electrode 4 is adjacent to the side surface 24 when viewed in the height direction (Z direction). The second sequence 822 within the shield electrode 4 is adjacent to the side surface 23 when viewed in the height direction (Z direction).

In the first sequence 811, two or more first ground connection electrodes 81 of the main body 2 are aligned in a predetermined direction that forms an angle with both the height direction and the direction normal to the side surface 23. In each of the second sequences 821 and 822, two or more second ground connection electrodes 82 of the main body 2 are aligned in the predetermined direction that forms an angle with both the height direction and the direction normal to the side surface 23. The second ground connection electrodes 82 in the second sequence 822, which is closer than the second sequence 821 to the antenna electrode 31, is less in number than the first ground connection electrodes 81 in the first sequence 811. This feature leads to a reduction in the capacitive coupling that could possibly be provided between the shield electrode 4 and the antenna electrode 31, thus yielding an improvement in antenna characteristics.

The input/output connection electrodes 83 are for use in connecting the substrate 5 to an input/output part of the external substrate 100 (see FIG. 2). Examples of the input/output part of the external substrate 100 include: a power source input terminal or a power source output terminal for the exchange of power between the external substrate 100 and the antenna module 1; a communication signal input terminal or a communication signal output terminal for the exchange of communication signals between the external substrate 100 and the antenna module 1; and a control signal input terminal or a control signal output terminal for the exchange of control signals between the external substrate 100 and the antenna module 1. More specifically, the second ground connection electrodes 82 are for use in connecting the electronic components on the substrate 5 to the external substrate 100. As illustrated in FIG. 3, the input/output connection electrodes 83 are each in the form of a column extending through the second dielectric layer 72. The input/output connection electrodes 83 are made of metal, such as copper. That is, the input/output connection electrodes 83 are columnar electrodes (posts) made of metal. The input/output connection electrodes 83 in the present embodiment each have an end portion exposed at the bottom surface 22. Each of the input/output connection electrodes 83 is connectable to the input/output part of the external substrate 100 with, for example, bumps therebetween. The bumps are herein denoted by 9.

Referring to FIG. 6, the input/output connection electrodes 83 are located within the shield electrode 4 when viewed in the height direction (the Z direction). The main body 2 in the present embodiment (see FIG. 6) includes more than one input/output connection electrode 83. Referring to FIG. 6, the main body 2 includes fourteen second ground connection electrodes 82. The fourteen input/output connection electrodes 83 constitute third sequences 831 and 832 (see FIG. 6), in which the fourteen input/output connection electrodes 83 are aligned in a direction (the first direction, namely, the X direction) normal to the side surface 23. The third sequences 831 and 832 each include seven input/output connection electrodes 83. Referring to FIG. 6, the third sequences 831 and 832 are located within the shield electrode 4 when viewed in the height direction (the Z direction). The third sequence 831 within the shield electrode 4 is adjacent to the side surface 25 when viewed in the height direction (Z direction). The third sequence 832 within the shield electrode 4 is adjacent to the side surface 26 when viewed in the height direction (Z direction). The third sequences 831 and 832 are located between the second sequences 821 and 822 when viewed in the height direction (the Z direction). The antenna module 1 including the constituent components disposed as above may be small in size and is capable of exhibiting improved antenna characteristics.

The auxiliary connection electrodes 84 are for use in connecting the substrate 5 to a part other than the ground of the external substrate 100. The auxiliary connection electrodes 84 in the present embodiment are for use in connecting the substrate 5 to an auxiliary connection part other than the ground and the input/output part of the external substrate 100. Examples of the auxiliary connection part include a dummy electrode and an antenna functionality extension electrode. The dummy electrode is disposed solely for the fixation of the auxiliary connection electrodes 84. Unlike the ground and the input/output part, the dummy electrode practically performs no function in an electric circuit. For the connection between the substrate 5 and the dummy electrode, the auxiliary connection electrodes 84 are connected to the substrate 5 in such a way as not to affect the operations and characteristics of the antenna module 1. The antenna functionality extension electrode is for use in extending the functionality of the antenna 3. More specifically, the antenna functionality extension electrode is for use in connecting the antenna 3 to an antenna circuit of the external substrate 100. The antenna circuit is for use in adjusting the electrical length of the antenna 3 and tuning the antenna 3 to a specified frequency. For the connection between the substrate 5 and the antenna functionality extension electrode, each of the auxiliary connection electrodes 84 is connectable to the antenna 3 with the substrate 5 therebetween.

As illustrated in FIG. 3, the auxiliary connection electrodes 84 are each in the form of a column extending through the second dielectric layer 72. The auxiliary connection electrodes 84 are made of metal, such as copper. That is, the auxiliary connection electrodes 84 are columnar electrodes (posts) made of metal. The auxiliary connection electrodes 84 in the present embodiment each have an end portion exposed at the bottom surface 22. Each of the auxiliary connection electrodes 84 is connectable to the auxiliary part of the external substrate 100 with, for example, bumps therebetween. The bumps are herein denoted by 9.

Referring to FIG. 6, the auxiliary connection electrode 84 are located between the antenna electrode 31 and the shield electrode 4 (i.e., in the antenna area 2a) when viewed in the height direction (the Z direction). The region between the antenna electrode 31 and the shield electrode 4 viewed in the height direction is thus available for the mounting of the antenna module 1 on the external substrate 100. Accordingly, the antenna module 1 can be more securely mounted on the external substrate 100. In view of antenna performance, the second ground connection electrodes 82 for the connection to the ground are disposed within the shield electrode 4 viewed in the height direction (the Z direction). Without the second ground connection electrodes 82 being disposed between the antenna electrode 31 and the shield electrode 4, part of the main body 2 in the present embodiment or, more specifically, the main body 2 between the antenna electrode 31 and shield electrode 4 would not be supported by the external substrate 100 and thus would not be securely mounted on the external substrate 100. As a workaround, the auxiliary connection electrodes 84 that are not for the connection to the ground and thus do not affect the antenna performance are disposed between the antenna electrode 31 and the shield electrode 4. With the auxiliary connection electrodes 84 being mounted on the external substrate 100, the antenna module 1 according to the present embodiment may be mounted on the external substrate 100 in a well-balanced fashion.

The main body 2 in the present embodiment (see FIG. 6) includes more than one auxiliary connection electrode 84. Referring to FIG. 6, the main body 2 includes six auxiliary connection electrodes 84. The six auxiliary connection electrodes 84 constitute a fourth sequence 841 (see FIG. 6), in which the six auxiliary connection electrodes 84 are aligned in a predetermined direction (the Y direction) that forms an angle with both the height direction and the direction normal to the side surface 23. Referring to FIG. 6, the fourth sequence 841 is located between the antenna electrode 31 and the shield electrode 4 (i.e., in the antenna area 2a) when viewed in the height direction (the Z direction). The antenna module 1 can be much more securely mounted on the external substrate 100.

[1.2 Evaluation]

As mentioned above, the second ground connection electrodes 82 are located within the shield electrode 4 of the antenna module 1 when viewed in the height direction (the Z direction). Thus, it is less likely that the second ground connection electrodes 82 will seemingly increase the adjacency of the antenna electrode 31 to the shield electrode 4. The second ground connection electrodes 82 may be included in such a way as not to interfere with the planned improvement of antenna performance. The inventor evaluated the antenna efficiency yielded by the layout in the present embodiment and the antenna efficiency yielded by the layout in a comparative example, with a view to determining the effect produced by the present embodiment in which the second ground connection electrodes 82 are located within the shield electrode 4 when viewed in the height direction (the Z direction). The second ground connection electrodes 82 in the comparative example are located between the shield electrode 4 and the antenna electrode 31 (i.e., in the antenna area 2a) when viewed in the height direction (the Z direction), whereas the second ground connection electrodes 82 in the present embodiment are located within the shield electrode 4 when viewed in the height direction (the Z direction).

Table 1 compares the antenna efficiency yielded by the layout in the present embodiment to the antenna efficiency yielded by the layout in the comparative example. The antenna efficiency was measured in units of dB. Antenna efficiency is the ratio of the radiant power of an antenna to the power that is inputted to the antenna.

TABLE 1

| Frequency (GHz) | Layout in Embodiment | Layout in Comparative Example |
|---|---|---|
| 2.4 | −3.9 | −4.6 |
| 2.442 | −3.2 | −4.1 |
| 2.484 | −3.3 | −4.2 |

As illustrated in Table 1, the evaluation revealed that the antenna efficiency yielded by the layout in the present embodiment was higher than the antenna efficiency yielded by the layout in the comparative example.

[1.3 Effects]

As described above, the antenna module 1 includes the main body 2, the antenna 3, and the shield electrode 4. The main body 2 has the top surface 21, the bottom surface 22, and the side surfaces 23 to 26. The top surface 21 and the bottom surface 22 are opposite to each other in the height direction. The antenna 3 includes the antenna electrode 31. The antenna electrode 31 covers one of the side surfaces 23 to 26. To be more specific, the antenna electrode 31 covers the side surface 23. The shield electrode 4 covers the top surface 21 without being in contact with the antenna electrode 31. The main body 2 includes the substrate 5, the electronic components (at least one first electronic component 61 and at least one second electronic component 62), the first dielectric layer 71, the second dielectric layer 72, at least one first ground connection electrode 81, and at least one second ground connection electrode 82. The substrate 5 has the first main surface 51 and the second main surface 52. The electronic components are mounted on the substrate 5 and are connected to the antenna 3. The first dielectric layer 71 covers the first main surface 51 and defines the top surface 21. The second dielectric layer 72 covers the second main surface 52 and defines the bottom surface 22. The at least one first ground connection electrode 81 is in the form of a column extending through the first dielectric layer 71 and connects the substrate 5 to the shield electrode 4. The at least one second ground connection electrode 82 is in the form of a column extending through the second dielectric layer 72 and is for use in connecting the substrate 5 to the ground of the external substrate 100. The at least one second ground connection electrode 82 is located within the shield electrode 4 when viewed in the height direction. The antenna module 1 including the constituent components disposed as above may be small in size and is capable of exhibiting improved antenna characteristics.

The antenna electrode 31 in the antenna module 1 extends across the first dielectric layer 71 and the second dielectric layer 72 in the height direction. Thus, the area of the antenna electrode 31 may be large enough to yield an improvement in antenna characteristics.

With the side surface 23 being mostly covered with the antenna electrode 31 in the antenna module 1, one end portion closer than the other end portion of the side surface 23 to the bottom surface 22 is exposed to view. This feature leads to a reduction in the capacitive coupling that could possibly be provided between the external substrate 100 and the antenna electrode 31.

The antenna electrode 31 in the antenna module 1 is entirely located on the side surface 23. The antenna module 1 including the constituent components disposed as above may be small in size and is capable of exhibiting improved antenna characteristics.

The side surface 23 is entirely covered with the antenna electrode 31 in the antenna module 1 in the direction orthogonal to the height direction within the plane (the YZ plane in FIG. 1) in which the side surface 23 extends. Thus, the area of the antenna electrode 31 may be large enough to yield an improvement in antenna characteristics.

The antenna 3 of the antenna module 1 includes the adjustment circuit 32 located on the substrate 5 and connected to the antenna electrode 31. The adjustment circuit 32 includes the wiring portion 33 for adjustment of the electrical length of the antenna 3 and/or the adjustment element 34 for tuning the antenna 3 to a specified frequency. The adjustment circuit 32 is located between the antenna electrode 31 and the shield electrode 4 when viewed in the height direction. This feature provides the ease of ensuring that the antenna 3 has the desired performance capabilities.

The adjustment circuit 32 in the antenna module 1 includes the wiring portion 33. The dimension d1 of the antenna electrode 31 in the height direction is greater than the width d2 of the wiring portion 33. The distal end of the antenna 3 is wider than the proximal end of the antenna 3. The antenna 3 is thus capable of exhibiting improved antenna characteristics.

The wiring portion 33 in the antenna 3 of the antenna module 1 includes the section 33b extending in the direction (the Y direction) that forms an angle with both the height direction and the direction (the X direction) normal to the side surface 23. This provides the ease of ensuring that the antenna 3 has the desired electrical length.

The main body 2 of the antenna module 1 includes more than one first ground connection electrode 81 and more than one second ground connection electrode 82. Two or more of the first ground connection electrodes 81 constitute at least one first sequence 811 in which the two or more first ground connection electrodes 81 are aligned in a predetermined direction that forms an angle with both the height direction and the direction normal to the side surface 23. Two or more of the second ground connection electrodes 82 constitute one or more second sequences 821 and 822 in which the two or more second ground connection electrodes 82 are aligned in the predetermined direction. The second ground connection electrodes 82 in the second sequence 822 closer than the second sequence 821 to the antenna electrode 31 is less in number than the first ground connection electrodes 81 in the first sequence 811 closer than the other first sequence(s) 811 to the antenna electrode 31. This feature leads to a reduction in the capacitive coupling that could possibly be provided between the shield electrode 4 and the antenna electrode 31, thus yielding an improvement in antenna characteristics.

The main body 2 of the antenna module 1 includes at least one auxiliary connection electrode 84. The auxiliary connection electrode 84 is in the form of a column extending through the second dielectric layer 72 and is for use in connecting the substrate 5 to a part other than the ground of the external substrate 100. The auxiliary connection electrode 84 is located between the antenna electrode 31 and the shield electrode 4 when viewed in the height direction. The region between the antenna electrode 31 and the shield electrode 4 viewed in the height direction is thus available for the mounting of the antenna module 1 on the external substrate 100. Accordingly, the antenna module 1 can be more securely mounted on the external substrate 100.

The main body 2 of the antenna module 1 includes at least one input/output connection electrode 83. The input/output connection electrode 83 is in the form of a column extending through the second dielectric layer 72 and is for use in connecting the substrate 5 to the input/output part of the external substrate 100. The input/output connection electrode 83 is located within the shield electrode 4 when viewed in the height direction. The antenna module 1 including the constituent components disposed as above may be small in size and is capable of exhibiting improved antenna characteristics.

The electronic components of the antenna module 1 include the first electronic components 61 mounted on the first main surface 51 and the second electronic components 62 mounted on the second main surface 52. The first dielectric layer 71 covers the first main surface 51 as well as the first electronic component 61. The second dielectric layer 72 covers the second main surface 52 as well as the second electronic component 62. The antenna module 1 including the constituent components disposed as above may be small in size and is capable of exhibiting improved antenna characteristics.

The second dielectric layer 72 of the antenna module 1 has the protrusion 27 adjacent to one end portion closer than the other end portion of the side surface 23 to the bottom surface 22. This feature leads to a reduction in the capacitive coupling that could possibly be provided between the external substrate 100 and the antenna electrode 31.

The antenna electrode 31 in the antenna module 1 includes the first section 311 covering the side surface 23 and the second section 312 extending from the edge of the first section 311 and along the protrusion 27. Thus, the area of the antenna electrode 31 may be large enough to yield an improvement in antenna characteristics.

The shield electrode 4 of the antenna module 1 covers one or more of the side surfaces 24 to 26 other than the side surface 23. Thus, the shield electrode 4 is capable of producing an improved shielding effect.

2. Modifications

The disclosure is not limited to the embodiment described above. Various alterations may be made to the embodiment in accordance with, for example, design features in such a manner that the possible benefit of the disclosure is achieved. The following describes modifications of the embodiment. These modifications may be employed in combination as appropriate.

Figure 7:
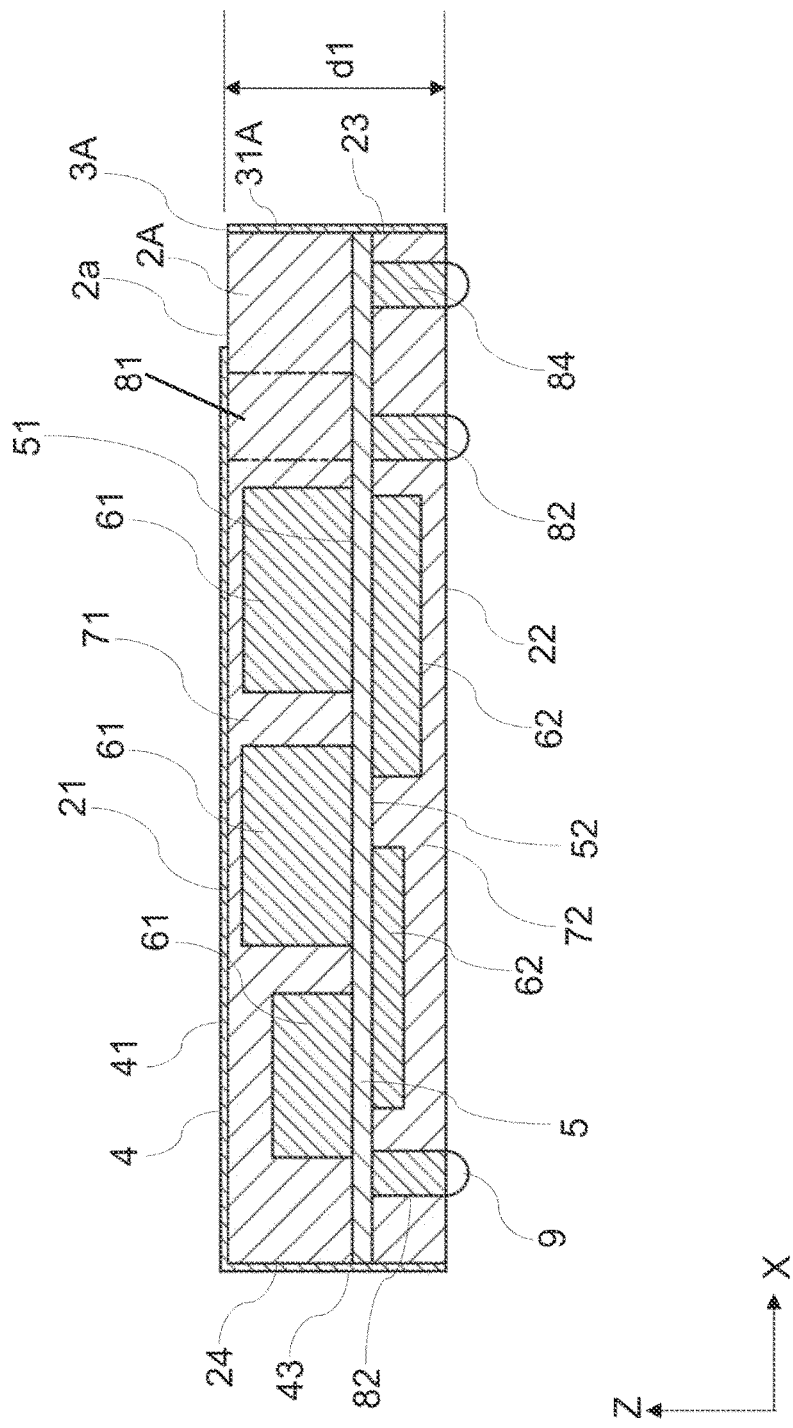
FIG. 7 is a sectional view of an antenna module according to Modification 1, illustrating an example configuration of the antenna module.

FIG. 7 is a sectional view of an antenna module 1A according to Modification 1, illustrating an example configuration of the antenna module 1A. Referring to FIG. 7, the antenna module 1A includes a main body 2A, an antenna 3A, and the shield electrode 4. Unlike the main body 2 of the antenna module 1 according to the embodiment described above, the main body 2A illustrated in FIG. 7 does not have the protrusion 27. The main body 2A is otherwise similar to the main body 2; that is, the main body 2A has the top surface 21, the bottom surface 22, and the side surfaces 23 to 26.

Referring to FIG. 7, the antenna 3A includes an antenna electrode 31A, which is entirely located on the side surface 23. The antenna 3A may thus be small in size and is capable of exhibiting improved antenna characteristics. Referring to FIG. 7, the antenna electrode 31A extends across the first dielectric layer 71 and the second dielectric layer 72 in the height direction. The area of the antenna electrode 31A in this case is larger than the area of the antenna electrode 31A in a case where the antenna electrode 31A does not extend off the edge of the first dielectric layer 71. Accordingly, improved antenna characteristics may be exhibited.

The antenna electrode 31A covers the side surface 23 or, more specifically, a region extending from the surface's edge adjacent to the top surface 21 to the surface's edge adjacent to the bottom surface 22. That is, the side surface 23 is entirely covered with the antenna electrode 31A in the height direction. Thus, the area of the antenna electrode 31A may be large.

The antenna electrode 31A is otherwise similar to the antenna electrode 31; that is, the side surface 23 is entirely covered with the antenna electrode 31A in the direction (the second direction, namely, the Y direction in FIG. 1) orthogonal to the height direction within the plane in which the side surface 23 extends. In other words, the antenna electrode 31A extends from one edge to the other edge of the side surface 23 in the second direction. Thus, the area of the antenna electrode 31A may be large enough to yield an improvement in antenna characteristics.

Figure 8:
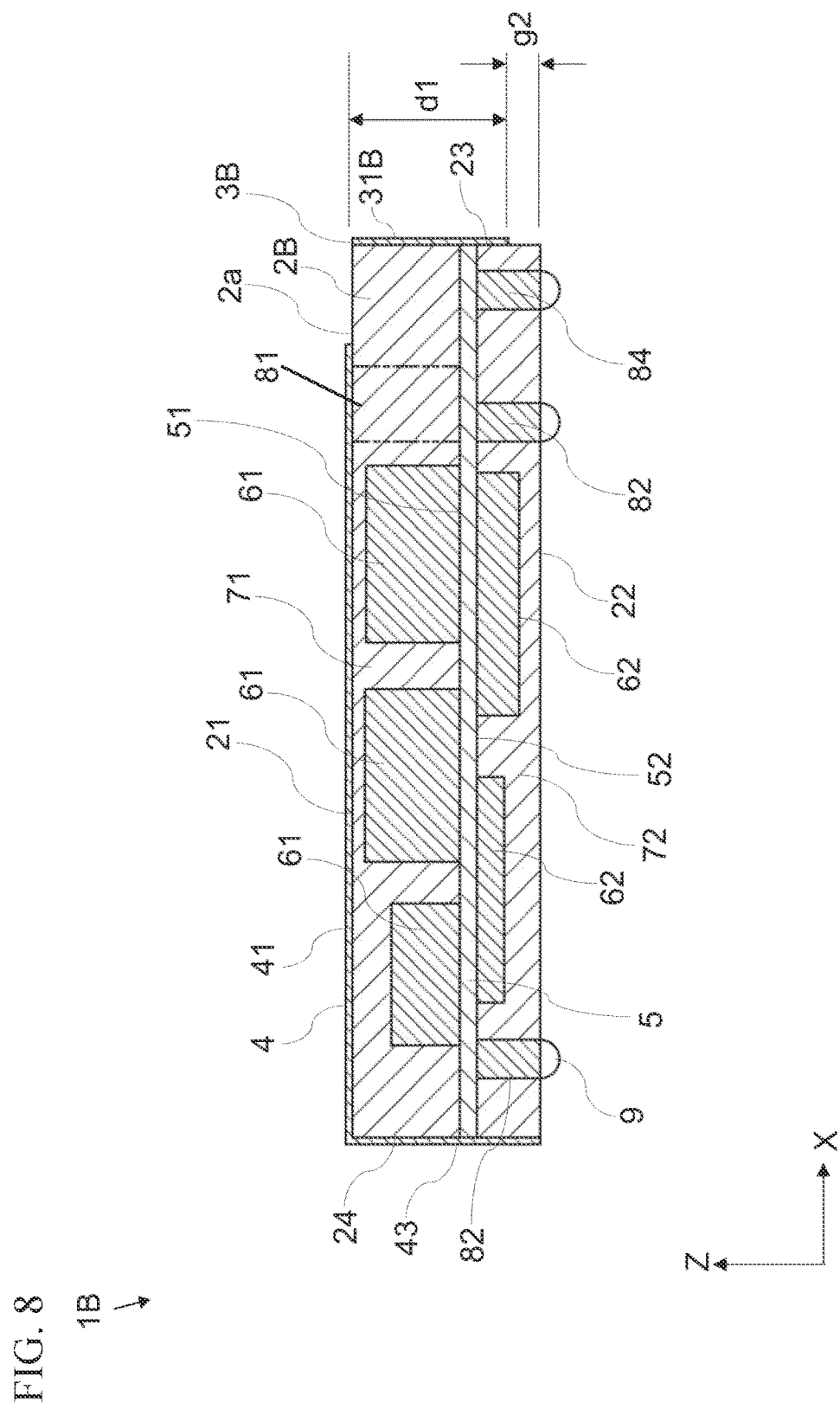
FIG. 8 is a sectional view of an antenna module according to Modification 2, illustrating an example configuration of the antenna module.

FIG. 8 is a sectional view of an antenna module 1B according to Modification 2, illustrating an example configuration of the antenna module 1B. Referring to FIG. 8, the antenna module 1B includes a main body 2B, an antenna 3B, and the shield electrode 4. Unlike the main body 2 of the antenna module 1 according to the embodiment described above, the main body 2B illustrated in FIG. 8 does not have the protrusion 27. The main body 2B is otherwise similar to the main body 2; that is, the main body 2B has the top surface 21, the bottom surface 22, and the side surfaces 23 to 26.

Referring to FIG. 8, the antenna 3B includes an antenna electrode 31B, which is entirely located on the side surface 23. The antenna 3B may thus be small in size and is capable of exhibiting improved antenna characteristics. Referring to FIG. 8, the antenna electrode 31B extends across the first dielectric layer 71 and the second dielectric layer 72 in the height direction. The area of the antenna electrode 31B in this case is larger than the area of the antenna electrode 31B in a case where the antenna electrode 31B does not extend off the edge of the first dielectric layer 71. Accordingly, improved antenna characteristics may be exhibited.

With the side surface 23 being mostly covered with the antenna electrode 31B, one end portion closer than the other end portion of the side surface 23 to the bottom surface 22 is exposed to view. Referring to FIG. 8, a region being part of the side surface 23 and located in a gap g2 between the antenna electrode 31B and one edge closer than the other edge of the side surface 23 to the bottom surface 22 is exposed to view. As compared with the antenna module 1A in FIG. 7, the antenna module 1B is more capable of reducing the capacitive coupling that could possibly be provided between the external substrate 100 and the antenna electrode. The area of the antenna electrode 31B is smaller than the area of the antenna electrode 31A.

The antenna electrode 31B is otherwise similar to the antenna electrode 31; that is, the side surface 23 is entirely covered with the antenna electrode 31B in the direction (the second direction, namely, the Y direction in FIG. 1) orthogonal to the height direction within the plane in which the side surface 23 extends. In other words, the antenna electrode 31B extends from one edge to the other edge of the side surface 23 in the second direction. Thus, the area of the antenna electrode 31B may be large enough to yield an improvement in antenna characteristics.

Figure 9:
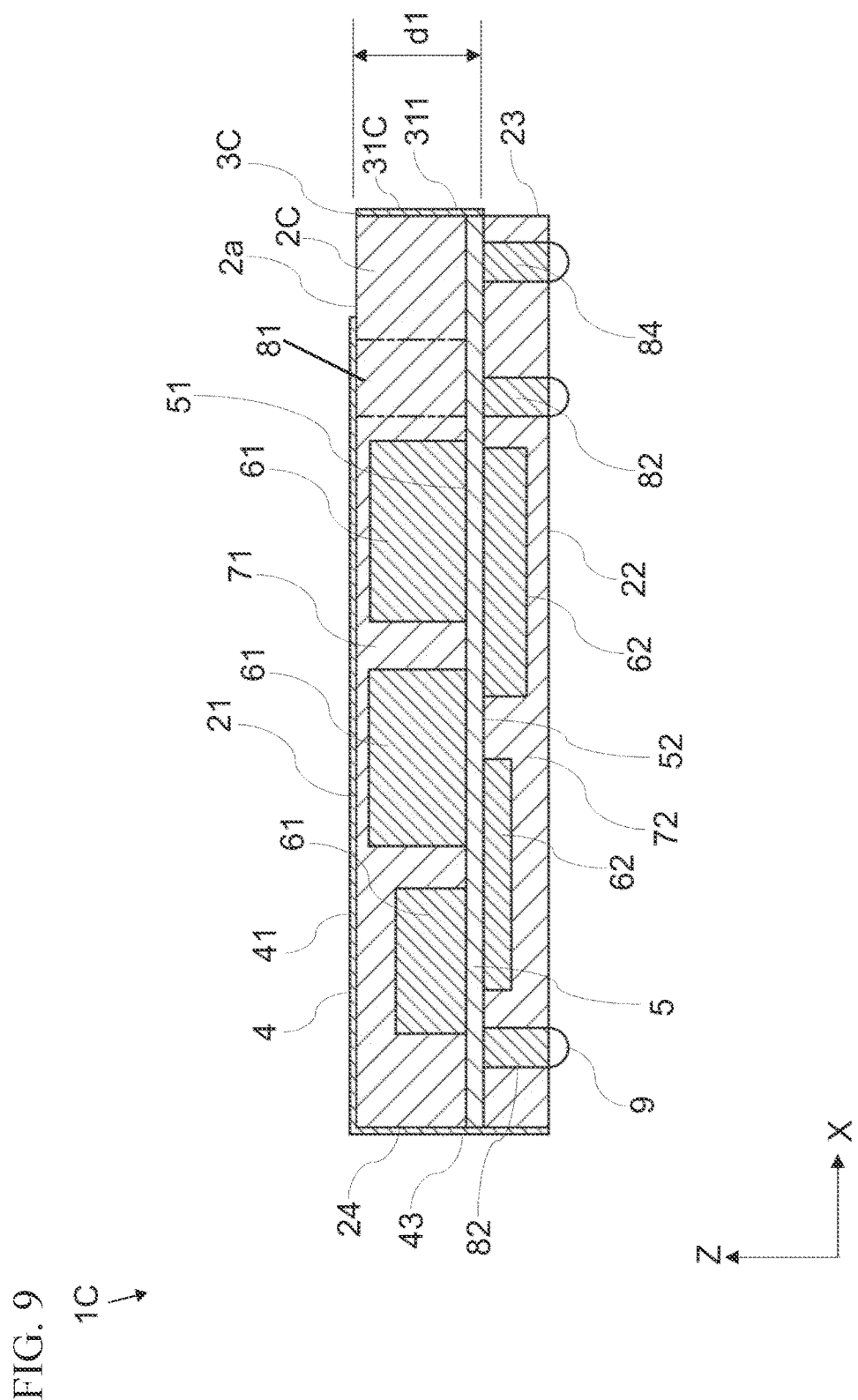
FIG. 9 is a sectional view of an antenna module according to Modification 3, illustrating an example configuration of the antenna module.

FIG. 9 is a sectional view of an antenna module 1C according to Modification 3, illustrating an example configuration of the antenna module 1C. Referring to FIG. 9, the antenna module 1C includes a main body 2C, an antenna 3C, and the shield electrode 4. Unlike the main body 2 of the antenna module 1 according to the embodiment described above, the main body 2C illustrated in FIG. 9 does not have the protrusion 27. The main body 2C is otherwise similar to the main body 2; that is, the main body 2C has the top surface 21, the bottom surface 22, and the side surfaces 23 to 26.

Referring to FIG. 9, the antenna 3C includes an antenna electrode 31C, which is entirely located on the side surface 23. The antenna 3C may thus be small in size and is capable of exhibiting improved antenna characteristics. Referring to FIG. 9, the antenna electrode 31C extends across the first dielectric layer 71 and the substrate 5 in the height direction. The antenna electrode 31C covers the side surface 23 or, more specifically, a region extending from the surface's edge adjacent to the top surface 21 to the surface's edge adjacent to the second main surface 52 of the substrate 5. As compared with the antenna module 1B in FIG. 8, the antenna module 1C is more capable of reducing the capacitive coupling that could possibly be provided between the external substrate 100 and the antenna electrode. The area of the antenna electrode 31C is smaller than the area of the antenna electrode 31B.

The antenna electrode 31C is otherwise similar to the antenna electrode 31; that is, the side surface 23 is entirely covered with the antenna electrode 31C in the direction (the second direction, namely, the Y direction in FIG. 1) orthogonal to the height direction within the plane in which the side surface 23 extends. In other words, the antenna electrode 31C extends from one edge to the other edge of the side surface 23 in the second direction. Thus, the area of the antenna electrode 31C may be large enough to yield an improvement in antenna characteristics.

As can be understood from the embodiment and Modifications 1 to 3, the antenna electrode may be variously shaped. Examples of the antenna electrode are not limited to those described above in relation to the embodiment and Modifications 1 to 3; that is, the antenna electrode may be changed as appropriate. The shape of the antenna electrode is to be determined based on the premise that an antenna with a greater apparent volume holds greater promise of exhibiting improved antenna characteristics.

Figure 10:
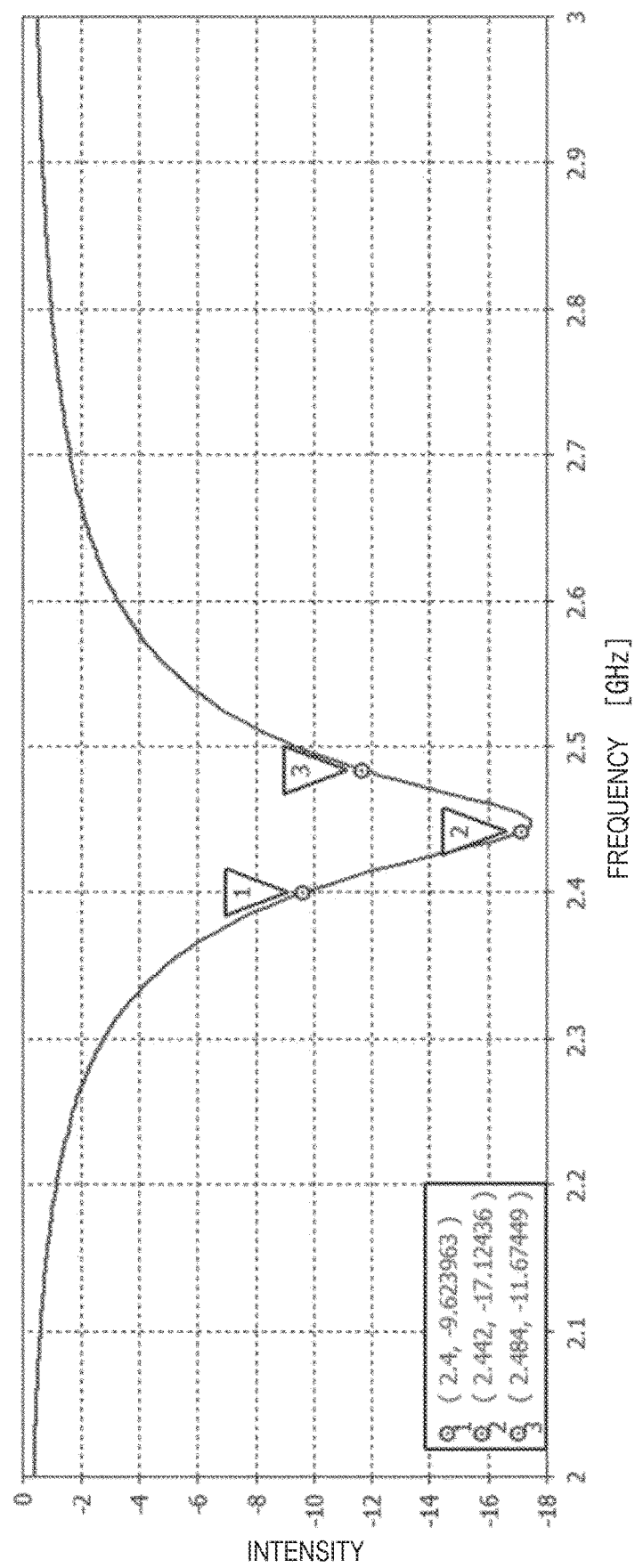
FIG. 10 is a graph illustrating the antenna characteristics of the antenna module in FIG. 1.
Figure 11:
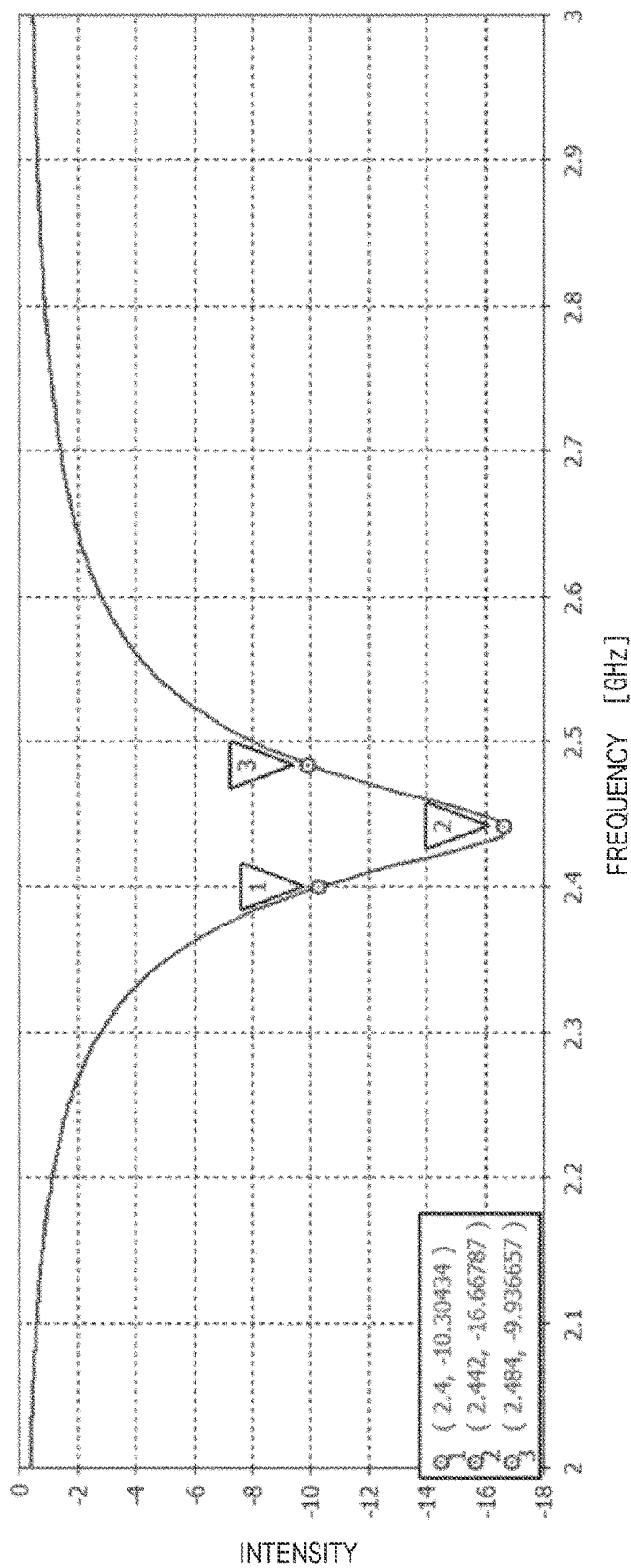
FIG. 11 is a graph illustrating the antenna characteristics of the antenna module in FIG. 7.

FIG. 10 is a graph illustrating the antenna characteristics of the antenna module 1 according to the embodiment described above with reference to FIG. 1. FIG. 11 is a graph illustrating the antenna characteristics of the antenna module 1A according to Modification 1 described above with reference to FIG. 7. Referring to FIGS. 10 and 11, a lower level of intensity denotes a higher level of radiation capability.

Table 2 compares the antenna efficiency yielded by the layout in the embodiment to the antenna efficiency yielded by the layout in Modification 1. The antenna efficiency was measured in units of dB. Antenna efficiency is the ratio of the radiant power of an antenna to the power that is inputted to the antenna.

TABLE 2

| Frequency (GHz) | Layout in Embodiment | Layout in Modification 1 |
| --- | --- | --- |
| 2.4 | −3.9 | −4.1 |
| 2.442 | −3.2 | −3.6 |
| 2.484 | −3.3 | −3.8 |

As illustrated in Table 2, the evaluation revealed that the antenna efficiency yielded by the layout in the embodiment described above was higher than the antenna efficiency yielded by the layout in Modification 1. This is presumably due to the following features: (1) the antenna electrode 31 in the embodiment is farther than the antenna electrode in Modification 1 from the external substrate 100; and (2) the second section 312 in the embodiment yields an increase in the area of the antenna electrode 31.

Other features that can be modified are enumerated below.

It is not required that the main body 2 have a particular shape. It is not required that the dimensions of the main body 2 in the height direction, the first direction, and the second direction have a particular magnitude relationship. It is not required that the main body 2 be a rectangular parallelepiped. The main body 2 may have any other shape defined by the top surface 21, the bottom surface 22, and more than one side surface. The substrate 5, the first dielectric layer 71, and the second dielectric layer 72 each may be shaped in conformity with the desired shape of the main body 2. Unlike in the embodiment described above, the side surfaces of the substrate 5 in some modifications are covered with the first dielectric layer 71 or the second dielectric layer 72. In this case, the first dielectric layer 71 and the second dielectric layer 72 may be provided as a one-piece member.

It is not required that the ground pattern 511 and the connection line 512 be formed on the first main surface 51 of the substrate 5. The ground pattern 511 and the connection line 512 may be formed on the second main surface 52. The substrate 5 may be a multilayer substrate, in which case the ground pattern 511 and the connection line 512 may be an intermediate layer of the substrate 5. It is not required that the ground pattern 511 and the connection line 512 each have a particular shape.

It is not required that the antenna 3 be adapted to communication performed in the frequency band used for Bluetooth (registered trademark). The antenna 3 may be tuned to the frequency band used for Wi-Fi radio communication. For example, Wi-Fi radio communication is performed at or around 2.4 GHz (e.g., in a range of 2.4 to 2.5 GHz) or is at or around 5 GHz (e.g., in a range of 5.15 to 5.8 GHz). A well-known frequency band, such as the midband specified by the second-generation mobile communication (2G) standard, the low band specified by the fourth-generation mobile communication (4G) standard, or the fifth-generation mobile communication (5G) standard, may be selected. The 2G standard is, for example, the Global System for Mobile Communications (GSM) (registered trademark) standard. The 4G standard is, for example, the 3GPP (registered trademark) Long Term Evolution (LTE) standard. The 5G standard is, for example, 5G New Radio (NR). A selection may be made from frequency bands for various communication standards including wireless LAN, specified low power radio, and short-distance wireless communication.

It is not required that the antenna electrode 31 be entirely located on the side surface 23. In other words, the antenna electrode 31 in some modifications is partially located on the top surface 21 and the side surfaces 25 and 26. In this case, the shield electrode 4 needs to be further set back to keep a distance from the antenna electrode 31. This results in a slight decrease in the area of the top surface 21 covered with the shield electrode 4 as compared to the case in which the antenna electrode 31 is entirely located on the side surface 23.

It is not required that the side surface 23 be entirely covered with the antenna electrode 31 in the direction (the second direction, namely, the Y direction in FIG. 1) orthogonal to the height direction within the plane in which the side surface 23 extends.

It is not required that the second section 312 be included in the antenna electrode 31.

It is not required that the adjustment circuit 32 be formed on the first main surface 51 of the substrate 5. The adjustment circuit 32 may be formed on the second main surface 52 of the substrate 5. The substrate 5 may be a multilayer substrate, in which case the adjustment circuit 32 may be an intermediate layer of the substrate 5. The adjustment circuit 32 or, more specifically, the wiring portion 33 of the adjustment circuit 32 may include a section extending on the first main surface 51, the interlayer of the substrate 5, and a section extending on the second main surface 52. This provides an additional ease of adjusting the electrical length. The wiring portion 33 of the adjustment circuit 32 may have a desired shape. The adjustment element 34 may be of any desired type, and the adjustment circuit 32 may include a desired number of adjustment elements 34. It is not required that adjustment circuit 32 include both the wiring portion 33 and the adjustment element 34; that is, the adjustment circuit 32 may include the wiring portion 33 and/or the adjustment element 34. The adjustment circuit 32 is optionally included. That is, the antenna 3 may include the antenna electrode 31 only.

It is not required that the shield electrode 4 have all of the side surface portions 42, 43, and 44; that is, the shield electrode 4 may have at least one of the side surface portions 42, 43, and 44. The shield electrode 4 may have none of the side surface portions 42, 43, and 44.

The number of electronic components (the first electronic components 61 and the second electronic components 62) is not limited to a particular value. The choice of what kinds of electronic components and how many electronic components are needed is to be made as appropriate with consideration given to the circuit configuration for performing communication via the antenna 3. As the electronic components, either only the first electronic components 61 or only the second electronic components 62 may be included.

It is not required the first ground connection electrodes 81, the second ground connection electrodes 82, the input/output connection electrodes 83, and the auxiliary connection electrode 84 each have a particular shape. The shapes of the connection electrodes may be changed as appropriate.

It is not required that the input/output connection electrodes 83 be located within the shield electrode 4 when viewed in the height direction. The input/output connection electrodes 83 may be located between the shield electrode 4 and the antenna electrode 31 when viewed in the height direction. With the input/output connection electrodes 83 disposed as above, the antenna module 1 can be more securely mounted on the external substrate 100.

The number of first ground connection electrodes 81, the number of second ground connection electrodes 82, the number of input/output connection electrodes 83, and the number of auxiliary connection electrode 84 are each not limited to a particular value and may be changed as appropriate.

Unlike in the embodiment described above, only one first ground connection electrode 81 or more than two first ground connection electrodes 81 may be included. When the number of first ground connection electrodes 81 is greater than two, two or more first ground connection electrodes 81 may constitute two or more first sequences in which the two or more first ground connection electrodes 81 are aligned in the predetermined direction that forms an angle with both the height direction and the direction normal to the side surface 23. Unlike in the embodiment described above, at least some of the second ground connection electrodes 82 may constitute one second sequence or may constitute more than two second sequences. The second ground connection electrodes 82 in the second sequence 822 closer than the second sequence 821 to the antenna electrode 31 is less in number than the first ground connection electrodes 81 in the first sequence closer than the other first sequence(s) to the antenna electrode 31. This feature leads to a reduction in the capacitive coupling that could possibly be provided between the shield electrode 4 and the antenna electrode 31, thus yielding an improvement in antenna characteristics.

It is not required that the auxiliary connection electrodes 84 be included in the antenna module 1. That is, the auxiliary connection electrodes 84 are optional.

3. Aspects of Disclosure

As can be understood from the embodiment and modifications described above, the disclosure involves the following aspects. The reference signs within parentheses are provided below solely for an explicit indication of the correspondence between each aspect and the embodiment described above. For the sake of simplicity, not all the parenthesized reference signs reappear in the subsequent sentences.

According to a first aspect of the disclosure, an antenna module (1; 1A to 1C) includes a main body (2; 2A to 2C), an antenna (3; 3A to 3C), and a shield electrode (4). The main body (2; 2A to 2C) has a top surface (21), a bottom surface (22), and a plurality of side surfaces (23 to 26). The top surface (21) and the bottom surface (22) are opposite to each other in a height direction. The antenna (3; 3A to 3C) includes an antenna electrode (31; 31A to 31C) that covers one of the plurality of side surfaces (23 to 26). The shield electrode (4) covers the top surface (21) without being in contact with the antenna electrode (31; 31A to 31C). The main body (2; 2A to 2C) includes a substrate (5), a plurality of electronic components (a first electronic component 61 and a second electronic component 62), a first dielectric layer (71), a second dielectric layer (72), at least one first ground connection electrode (81), and at least one second ground connection electrode (82). The substrate (5) has a first main surface (51) and a second main surface (52). The plurality of electronic components (the first electronic component 61 and the second electronic component 62) are mounted on the substrate (5) and are connected to the antenna (3; 3A to 3C). The first dielectric layer (71) covers the first main surface (51) and defines the top surface (21). The second dielectric layer (72) covers the second main surface (52) and defines the bottom surface (22). The at least one first ground connection electrode (81) is in the form of a column extending through the first dielectric layer (71) and connects the substrate (5) to the shield electrode (4). The at least one second ground connection electrode (82) is in the form of a column extending through the second dielectric layer (72) and is for use in connecting the substrate (5) to the ground of an external substrate (100). The at least one second ground connection electrode (82) is located within the shield electrode (4) when viewed in the height direction. The antenna module may thus be small in size and is capable of exhibiting improved antenna characteristics.

According to a second aspect, the antenna module (1; 1A, 1B) according to the first aspect is as follows. The antenna electrode (31; 31A, 31B) extends across the first dielectric layer (71) and the second dielectric layer (72) in the height direction. Thus, the area of the antenna electrode (31; 31A, 31B) may be large enough to yield an increase in the apparent volume of the antenna and, by extension, an improvement in antenna characteristics.

According to a third aspect, the antenna module (1; 1B, 1C) according to the first aspect is as follows. With the one side surface (23) being mostly covered with the antenna electrode (31; 31B, 31C), one end portion closer than the other end portion of the one side surface (23) to the bottom surface (22) is exposed to view. This feature leads to a reduction in the capacitive coupling that could possibly be provided between the external substrate (100) and the antenna electrode (31; 31B, 31C).

According to a fourth aspect, the antenna module (1; 1A to 1C) according to any one of the first to third aspects is as follows. The antenna electrode (31; 31A to 31C) is entirely located on the one side surface (23). The antenna module may thus be small in size and is capable of exhibiting improved antenna characteristics.

According to a fifth aspect, the antenna module (1; 1A to 1C) according to any one of the first to fourth aspects is as follows. The one side surface (23) is entirely covered with the antenna electrode (31; 31A to 31C) in a direction orthogonal to the height direction within a plane in which the one side surface (23) extends. Thus, the area of the antenna electrode (31; 31A, 31C) may be large enough to yield an increase in the apparent volume of the antenna and, by extension, an improvement in antenna characteristics.

According to a sixth aspect, the antenna module (1; 1A to 1C) according to any one of the first to fifth aspects is as follows. The antenna (3; 3A to 3C) includes an adjustment circuit (32) located on the substrate (5) and connected to the antenna electrode (31; 31A to 31C). The adjustment circuit (32) includes a wiring portion (33) for adjustment of the electrical length of the antenna (3; 3A to 3C) and/or an adjustment element (34) for tuning the antenna (3; 3A to 3C) to a specified frequency. The adjustment circuit (32) is located between the antenna electrode (31; 31A to 31C) and the shield electrode (4) when viewed in the height direction. This feature provides the ease of ensuring that the antenna (3; 3A to 3C) has the desired performance capabilities.

According to a seventh aspect, the antenna module (1; 1A to 1C) according to the sixth aspect is as follows. The adjustment circuit (32) includes the wiring portion (33). The dimension (d1) of the antenna electrode (31; 31A to 31C) in the height direction is greater than the width (d2) of the wiring portion (33). Thus, the distal end of the antenna electrode (3; 3A to 3C) is wider than the proximal end of the antenna electrode (3; 3A to 3C). This yields an increase in the apparent volume of the antenna and, by extension, an improvement in antenna characteristics.

According to an eighth aspect, the antenna module (1; 1A to 1C) according to the seventh aspect is as follows. The wiring portion (33) includes a section (33*b*) extending in a direction that forms an angle with both the height direction and a direction normal to the one side surface (23). This provides the ease of ensuring that the antenna (3; 3A to 3C) has the desired electrical length.

According to a ninth aspect, the antenna module (1; 1A to 1C) according to any one of the first to eighth aspects is as follows. The main body (2; 2A to 2C) includes more than one first ground connection electrode (81) and more than one second ground connection electrode (82). Two or more of the plurality of first ground connection electrodes (81) constitute at least one first sequence (811) in which the two or more first ground connection electrodes (81) are aligned in a predetermined direction that forms an angle with both the height direction and a direction normal to the one side surface (23). Two or more of the plurality of second ground connection electrodes (82) constitute at least one second sequence (821, 822) in which the two or more second ground connection electrodes (82) are aligned in the predetermined direction. The second ground connection electrodes (82) in the second sequences (822) closer than the other second sequence(s) (821) to the antenna electrode (31; 31A to 31C) is less in number than the first ground connection electrodes (81) in the first sequence (811) closer than the other first sequence(s) (811) to the antenna electrode (31; 31A to 31C). This feature leads to a reduction in the capacitive coupling that could possibly be provided between the shield electrode (4) and the antenna electrode (31; 31A to 31C), thus yielding an improvement in antenna characteristics.

According to a tenth aspect, the antenna module (1; 1A to 1C) according to any one of the first to ninth aspects is as follows. The main body (2; 2A to 2C) includes at least one auxiliary connection electrode (84). The at least one auxiliary connection electrode (84) is in the form of a column extending through the second dielectric layer (72) and is for use in connecting the substrate (5) to a part other than the ground of the external substrate (100). The at least one auxiliary connection electrode (84) is located between the antenna electrode (31; 31A to 31C) and the shield electrode (4) when viewed in the height direction. The region between the antenna electrode (31; 31A to 31C) and the shield electrode (4) viewed in the height direction is thus available for the mounting of the antenna module (1; 1A to 1C) onto the external substrate (100). Accordingly, the antenna module (1; 1A to 1C) can be more securely mounted on the external substrate (100).

According to an eleventh aspect, the antenna module (1; 1A to 1C) according to the tenth aspect is as follows. The main body (2; 2A to 2C) includes at least one input/output connection electrode (83). The at least one input/output connection electrode (83) is in the form of a column extending through the second dielectric layer (72) and is for use in connecting the substrate (5) to an input/output part of the external substrate (100). The at least one input/output connection electrode (83) is located within the shield electrode (4) when viewed in the height direction. The antenna module may thus be small in size and is capable of exhibiting improved antenna characteristics.

According to a twelfth aspect, the antenna module (1; 1A to 1C) according to any one of the first to eleventh aspects is as follows. The plurality of electronic components include a first electronic component (61) mounted on the first main surface (51) and a second electronic component (62) mounted on the second main surface (52). The first dielectric layer (71) covers the first main surface (51) as well as the first electronic component (61). The second dielectric layer (72) covers the second main surface (52) as well as the second electronic component (62). The antenna module may thus be small in size and is capable of exhibiting improved antenna characteristics.

According to a thirteenth aspect, the antenna module (1; 1A to 1C) according to any one of the first to twelfth aspects is as follows. The second dielectric layer (72) has a protrusion (27) adjacent to one end portion closer than the other end portion of the one side surface (23) to the bottom surface (22). This feature leads to a reduction in the capacitive coupling that could possibly be provided between the external substrate (100) and the antenna electrode (31; 31B, 31C).

According to a fourteenth aspect, the antenna module (1; 1A to 1C) according to any one of the first to thirteenth aspects is as follows. The antenna electrode (31; 31A to 31C) includes a first section (311) covering the one side surface (23) and a second section (312) extending from an edge of the first section (311) and along the protrusion (27). Thus, the antenna electrode (31; 31A, 31B) may be large enough to yield an increase in the apparent volume of the antenna and, by extension, an improvement in antenna characteristics.

According to a fifteenth aspect, the antenna module (1; 1A to 1C) according to any one of the first to fourteenth aspects is as follows. The shield electrode (4) covers one or more of the plurality of side surfaces (24 to 26) other than the one side surface (23). Thus, the shield electrode (4) is capable of producing an improved shielding effect.

The second to fifteenth aspects are optional.

The disclosure is applicable to an antenna module. More specifically, the disclosure is applicable to an antenna module into which an antenna and electronic components are integrated.

What is claimed is:

1. An antenna module comprising:
   a main body having a top surface, a bottom surface, and a plurality of side surfaces, the top surface and the bottom surface being opposite to each other in a height direction;
   an antenna including an antenna electrode covering one side surface among the plurality of side surfaces; and
   a shield electrode covering the top surface without being in contact with the antenna electrode, wherein
   the main body includes
     a substrate having a first main surface and a second main surface,
     a plurality of electronic components mounted on the substrate and connected to the antenna,
     a first dielectric layer covering the first main surface and defining the top surface,
     a second dielectric layer covering the second main surface and defining the bottom surface,
     at least one first ground connection electrode being in form of a column extending through the first dielectric layer and connecting the substrate to the shield electrode, and
     at least one second ground connection electrode being in form of a column extending through the second dielectric layer and being for use in connecting the substrate to a ground of an external substrate, and
     the at least one second ground connection electrode is located within the shield electrode when viewed in the height direction.

2. The antenna module according to claim 1, wherein the antenna electrode is arranged across the first dielectric layer and the second dielectric layer in the height direction.

3. The antenna module according to claim 2, wherein the antenna includes an adjustment circuit located on the substrate and connected to the antenna electrode, the adjustment circuit includes a wiring portion for adjustment of an electrical length of the antenna and/or an adjustment element for tuning the antenna to a specified frequency, and
   the adjustment circuit is located between the antenna electrode and the shield electrode when viewed in the height direction.

4. The antenna module according to claim 2, wherein
   the at least one first ground connection electrode included in the main body comprises a plurality of first ground connection electrodes,
   the at least one second ground connection electrode included in the main body comprises a plurality of second ground connection electrodes,
   two or more of the plurality of first ground connection electrodes constitute at least one first sequence in which the two or more first ground connection electrodes are aligned in a predetermined direction forming an angle with both the height direction and a direction normal to the one side surface,
   two or more of the plurality of second ground connection electrodes constitute at least one second sequence in which the two or more second ground connection electrodes are aligned in the predetermined direction, and
   the second ground connection electrodes in the second sequence closer than the other second sequence(s) to the antenna electrode is less in number than the first ground connection electrodes in the first sequence closer than the other first sequence(s) to the antenna electrode.

5. The antenna module according to claim 1, wherein with the one side surface being covered with the antenna electrode, one end portion closer than the other end portion of the one side surface to the bottom surface is exposed to view.

6. The antenna module according to claim 5, wherein
   the antenna includes an adjustment circuit located on the substrate and connected to the antenna electrode,
   the adjustment circuit includes a wiring portion for adjustment of an electrical length of the antenna and/or an adjustment element for tuning the antenna to a specified frequency, and
   the adjustment circuit is located between the antenna electrode and the shield electrode when viewed in the height direction.

7. The antenna module according to claim 1, wherein the antenna electrode is entirely located on the one side surface.

8. The antenna module according to claim 7, wherein
   the antenna includes an adjustment circuit located on the substrate and connected to the antenna electrode,
   the adjustment circuit includes a wiring portion for adjustment of an electrical length of the antenna and/or an adjustment element for tuning the antenna to a specified frequency, and
   the adjustment circuit is located between the antenna electrode and the shield electrode when viewed in the height direction.

9. The antenna module according to claim 1, wherein the one side surface is entirely covered with the antenna electrode in a direction orthogonal to the height direction within a plane in which the one side surface extends.

10. The antenna module according to claim 9, wherein
    the antenna includes an adjustment circuit located on the substrate and connected to the antenna electrode, the adjustment circuit includes a wiring portion for adjustment of an electrical length of the antenna and/or an adjustment element for tuning the antenna to a specified frequency, and the adjustment circuit is located between the antenna electrode and the shield electrode when viewed in the height direction.

11. The antenna module according to claim 1, wherein the antenna includes an adjustment circuit located on the substrate and connected to the antenna electrode, the adjustment circuit includes a wiring portion for adjustment of an electrical length of the antenna and/or an adjustment element for tuning the antenna to a specified frequency, and the adjustment circuit is located between the antenna electrode and the shield electrode when viewed in the height direction.

12. The antenna module according to claim 11, wherein the adjustment circuit includes the wiring portion, and a dimension of the antenna electrode in the height direction is greater than a width of the wiring portion.

13. The antenna module according to claim 12, wherein the wiring portion includes a section extending in a direction forming an angle with both the height direction and a direction normal to the one side surface.

14. The antenna module according to claim 1, wherein the at least one first ground connection electrode included in the main body comprises a plurality of first ground connection electrodes, the at least one second ground connection electrode included in the main body comprises a plurality of second ground connection electrodes, two or more of the plurality of first ground connection electrodes constitute at least one first sequence in which the two or more first ground connection electrodes are aligned in a predetermined direction forming an angle with both the height direction and a direction normal to the one side surface, two or more of the plurality of second ground connection electrodes constitute at least one second sequence in which the two or more second ground connection electrodes are aligned in the predetermined direction, and the second ground connection electrodes in the second sequence closer than the other second sequence(s) to the antenna electrode is less in number than the first ground connection electrodes in the first sequence closer than the other first sequence(s) to the antenna electrode.

15. The antenna module according to claim 1, wherein the main body includes at least one auxiliary connection electrode, the at least one auxiliary connection electrode is in form of a column extending through the second dielectric layer and is for use in connecting the substrate to a part other than the ground of the external substrate, and the at least one auxiliary connection electrode is located between the antenna electrode and the shield electrode when viewed in the height direction.

16. The antenna module according to claim 15, wherein the main body includes at least one input/output connection electrode, the at least one input/output connection electrode is in form of a column extending through the second dielectric layer and is for use in connecting the substrate to an input/output part of the external substrate, and the at least one input/output connection electrode is located within the shield electrode when viewed in the height direction.

17. The antenna module according to claim 1, wherein the plurality of electronic components include a first electronic component mounted on the first main surface and a second electronic component mounted on the second main surface, the first dielectric layer covers the first main surface as well as the first electronic component, and the second dielectric layer covers the second main surface as well as the second electronic component.

18. The antenna module according to claim 1, wherein the second dielectric layer has a protrusion adjacent to one end portion closer than the other end portion of the one side surface to the bottom surface.

19. The antenna module according to claim 18, wherein the antenna electrode includes a first section covering the one side surface and a second section extending from an edge of the first section and along the protrusion.

20. The antenna module according to claim 1, wherein the shield electrode covers one or more of the plurality of side surfaces other than the one side surface.

* * * * *